United States Patent
Wang et al.

(10) Patent No.: US 10,177,151 B1
(45) Date of Patent: Jan. 8, 2019

(54) SINGLE-DIFFUSION BREAK STRUCTURE FOR FIN-TYPE FIELD EFFECT TRANSISTORS

(71) Applicant: GLOBALFOUNDRIES INC., Grand Cayman (KY)

(72) Inventors: Yanzhen Wang, Clifton Park, NY (US); Hui Zang, Guilderland, NY (US); Bingwu Liu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/632,702

(22) Filed: Jun. 26, 2017

(51) Int. Cl.
| | |
|---|---|
| *H01L 23/535* | (2006.01) |
| *H01L 27/092* | (2006.01) |
| *H01L 29/06* | (2006.01) |
| *H01L 21/8238* | (2006.01) |
| *H01L 29/66* | (2006.01) |

(52) U.S. Cl.
CPC .. *H01L 27/0924* (2013.01); *H01L 21/823878* (2013.01); *H01L 23/535* (2013.01); *H01L 29/0649* (2013.01); *H01L 29/66545* (2013.01)

(58) Field of Classification Search
CPC ........... H01L 21/823878; H01L 23/535; H01L 29/0649; H01L 29/66545
See application file for complete search history.

(56) References Cited

U.S. PATENT DOCUMENTS

| | | |
|---|---|---|
| 8,846,491 B1 | 9/2014 | Pham et al. |
| 8,916,460 B1 | 12/2014 | Kwon et al. |
| 9,171,752 B1* | 10/2015 | Wu ................... H01L 21/76224 |
| 9,263,516 B1 | 2/2016 | Wu et al. |
| 9,368,496 B1 | 6/2016 | Yu et al. |
| 9,406,676 B2 | 8/2016 | Yu et al. |
| 9,412,616 B1 | 8/2016 | Xie et al. |
| 9,425,252 B1 | 8/2016 | Zang et al. |
| 9,431,396 B2 | 8/2016 | Zang et al. |
| 9,524,911 B1 | 12/2016 | Tsai et al. |
| 9,589,845 B1 | 3/2017 | Jagannathan et al. |
| 9,608,062 B1* | 3/2017 | Tseng ................... H01L 29/0653 |

(Continued)

*Primary Examiner* — Joseph Galvin, III
(74) *Attorney, Agent, or Firm* — Gibb & Riley, LLC; Francois Pagette

(57) ABSTRACT

A method and structure for a semiconductor device that includes one or more fin-type field effect transistors (FIN-FETs) and single-diffusion break (SDB) type isolation regions, which are within a semiconductor fin and define the active device region(s) for the FINFET(s). Asymmetric trenches are formed in a substrate through asymmetric cuts in sacrificial fins formed on the substrate. The asymmetric cuts have relatively larger gaps between fin portions that are closest to the substrate, and deeper portions of the asymmetric trenches are relatively wider than shallower portions. Channel regions are formed in the substrate below two adjacent fins. Source/drain regions of complementary transistors are formed in the substrate on opposite sides of the channel regions. The asymmetric trenches are filled with an insulator to form a single-diffusion break between two source/drain regions of different ones of the complementary transistors. Also disclosed is a semiconductor structure formed according to the method.

20 Claims, 19 Drawing Sheets

(56) References Cited

U.S. PATENT DOCUMENTS

| | | | |
|---|---|---|---|
| 2009/0325359 A1* | 12/2009 | Liu | H01L 21/76229 438/424 |
| 2014/0001555 A1* | 1/2014 | Cheng | H01L 21/84 257/347 |
| 2014/0117454 A1 | 5/2014 | Liu et al. | |
| 2016/0049468 A1 | 2/2016 | Wu et al. | |
| 2016/0225762 A1 | 8/2016 | Zang et al. | |
| 2017/0053980 A1 | 2/2017 | Liou et al. | |

* cited by examiner

SINGLE-DIFFUSION BREAK STRUCTURE FOR FIN-TYPE FIELD EFFECT TRANSISTORS

BACKGROUND

Field of the Invention

The present invention relates to single-diffusion break (SDB) isolation structures for fin-type field effect transistors (FINFETs) and a method of forming such SDB isolation structures.

Description of Related Art

More specifically, integrated circuit design decisions are often driven by device scalability, device density, manufacturing efficiency and costs. For example, size scaling of planar field effect transistors (FETs) resulted in the development of planar FETs with relatively short channel lengths and, unfortunately, the smaller channel lengths resulted in a corresponding increase in short channel effects and a decrease in drive current. In response, non-planar FET technologies (e.g., fin-type FET (FINFET) technologies) were developed. A FINFET is a non-planar FET that incorporates a semiconductor fin (i.e., a relatively tall and thin, elongated, rectangular-shaped, semiconductor body) and, within the semiconductor fin, a channel region positioned laterally between source/drain regions. A gate is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits increased drive current. Unfortunately, as FINFET size continues to decrease and FINFET density continues to increase, it can be difficult to form FINFETs without compromising robustness.

To continuously reduce the total area in FINFET technology, an isolation structure, referred to as Single-diffusion Break (SDB) may be implemented. SDB is a kind of isolation structure with a single dummy gate on top between two FINFETs. Currently, the SDB can only be used to isolate transistors with the same polarity (i.e. between NFET to NFET or PFET to PFET). In other words, the current SDB structure has no capability to isolate transistors of opposite polarity (e.g. between NFET and PFET) as related to the critical dimension (CD) and overlay among n-well, p-well, and SDB with worse case resulting in short or leakage between N+ to the n-well or p+ to the p-well. Accordingly, a need remains for an SDB structure and method to enable the isolation between transistors of opposite types.

SUMMARY

In view of the foregoing, disclosed herein is a method of forming a semiconductor structure that includes one or more fin-type field effect transistors (FINFETs) and single-diffusion break (SDB) type isolation regions, which define the active device region(s) for the FINFET(s). Specifically, in the method, an SDB structure with an enlarged bottom can be formed (in a self-aligned manner), so that the leakage or shorting paths between the n-well of a first transistor and the N+ doped region of an adjacent transistor or between the P+ doped region of the adjacent transistor and the p-well of the first transistor are eliminated under worst-case process variations of critical dimensions and overlay. Thus, the SDB structure disclosed herein has stronger scalability for isolating FINFETs not only between devices having the same polarity but also FINFETs having opposite polarity. Also disclosed herein is a semiconductor structure formed according to the method.

More particularly, disclosed herein are embodiments of a method of forming a semiconductor structure that includes one or more fin-type field effect transistors (FINFETs) and single-diffusion break (SDB)-type isolation regions, which define the active device region(s) for the FINFET(s).

Generally, each of the method embodiments includes forming trenches in a semiconductor fin to define at least one active device region within the semiconductor fin. A cavity with an enlarged bottom area is formed below each trench. Subsequently, an isolation layer can be deposited into the trench and cavity so as to fill the space within the trenches and cavity, thereby forming trench isolation regions and, particularly, SDB-type isolation regions. After the trench isolation regions are formed, source/drain recesses can be formed within the active device region adjacent to the trench isolation regions.

In one particular method embodiment, sacrificial fins are formed in parallel on a substrate. The sacrificial fins include a middle fin between two adjacent fins. The middle fin is in a location for a dummy gate and the two adjacent fins are in locations for gate conductors of adjacent complementary transistors. Portions of the sacrificial fins are removed to form asymmetric cuts in the sacrificial fins. The asymmetric cuts have relatively larger gaps between fin portions that are closest to the substrate. Asymmetric trenches are formed in the substrate through the asymmetric cuts. Deeper portions of the asymmetric trenches are relatively wider than shallower portions. The asymmetric trenches are filled with an insulator to form a single-diffusion break. Channel regions are formed in the substrate below the two adjacent fins. Source/drain regions of different transistors are formed in the substrate on opposite sides of the channel regions. The single-diffusion break is between two of the source/drain regions of different ones of the complementary transistors. The sacrificial fins are replaced with conductors to form the dummy gate over the single-diffusion break and the gate conductors over the channel regions.

Such methods can be used during the formation of a variety of IC structures such as IC structures that incorporate fin-type field effect transistors (FINFETs), IC structures that incorporate a conventional gate-first gate or a replacement metal gate, IC structures that incorporate a FET with multiple semiconductor bodies, IC structures that incorporate a complementary metal oxide semiconductor (CMOS) device with both an N-type FET (NFET) and a P-type FET (PFET), IC structures that incorporate a CMOS devices where the NFET and PFET have a shared gate, etc.

Thus, for example, one method embodiment disclosed herein can be used to form an IC structure that incorporates multiple FINFETs and, particularly, that incorporates a CMOS device, where the NFET and PFET are FINFETs, each with one or more semiconductor bodies and where the NFET and PFET share a replacement metal gate.

Specifically, in this method embodiment a first semiconductor body for a first-type field effect transistor (e.g., an NFET) and a second semiconductor body for a second-type field effect transistor (e.g., a PFET) are formed in a substrate. The first-type field effect transistor is adjacent to the second-type field effect transistor. Each first semiconductor body can have areas designated for first source/drain regions and a first channel region positioned laterally between the first source/drain regions and each second semiconductor body can have areas designated for second source/drain regions and a second channel region positioned laterally between the second source/drain regions. On a first channel region in the first semiconductor body and a second channel region in the second semiconductor body, sacrificial fins are formed in parallel. The sacrificial fins include a middle fin between two adjacent fins. The middle fin is in a location for a dummy gate, and the two adjacent fins are in locations for gate conductors of the first-type field effect transistor and the second-type field effect transistor. Portions of the sacrificial fins are removed to form asymmetric cuts in the sacrificial fins. The asymmetric cuts having relatively larger gaps between fin portions that are closest to the substrate. Asymmetric trenches are formed in the substrate through the asymmetric cuts. Deeper portions of the asymmetric trenches are relatively wider than shallower portions. The asymmetric trenches are filled with an insulator to form a single-diffusion break. Source/drain regions of the first-type field effect transistor and the second-type field effect transistor are formed in the substrate on opposite sides of the channel regions. The single-diffusion break is between two of the source/drain regions of the transistors. The sacrificial fins are replaced with conductors to form the dummy gate over the single-diffusion break and the gate conductors over the channel regions.

Also disclosed herein are embodiments of a semiconductor structure that includes one or more fin-type field effect transistors (FINFETs) and single-diffusion break (SDB) type isolation regions, which define the active device region(s) for the FINFET(s). Specifically, the semiconductor structure can include a semiconductor fin and one or more active device regions for one or more FINFETs located within the semiconductor fin.

The semiconductor structure can further include trench isolation regions and, particularly, SDB-type isolation regions located within the semiconductor fin such that each active device region is positioned laterally between a pair of trench isolation regions. Each trench isolation region (i.e., each SDB-type isolation region) can include a trench that extends essentially vertically into the semiconductor fin and that has a lower portion and an upper portion above the lower portion. The upper portion has opposing sidewalls and a first width between the opposing sidewalls. The lower portion has a second width larger than the first width so that the separation at the bottom of the fin is larger than the separation at the top of the fin. With each trench, an isolation layer fills the lower portion and the upper portion of the trench. The semiconductor structure can further include at least one transistor and, particularly, at least one FINFET. The FINFET can include, within an active device region of the semiconductor fin, source/drain regions and a channel region positioned laterally between the source/drain regions.

The above described IC structures can, for example, incorporate non-planar FET(s), can incorporate a conventional gate-first gate or a replacement metal gate, can incorporate a FET with multiple semiconductor bodies, can incorporate a complementary metal oxide semiconductor (CMOS) device with both an N-type FET (NFET) and a P-type FET (PFET), can incorporate a CMOS devices where the NFET and PFET have a shared gate, etc.

BRIEF DESCRIPTION OF THE SEVERAL VIEWS OF THE DRAWINGS

Various examples of the devices and methods of the present invention will be better understood from the following detailed description with reference to the accompanying drawings, which are not necessarily drawn to scale and in which.

DETAILED DESCRIPTION

Figure 1:
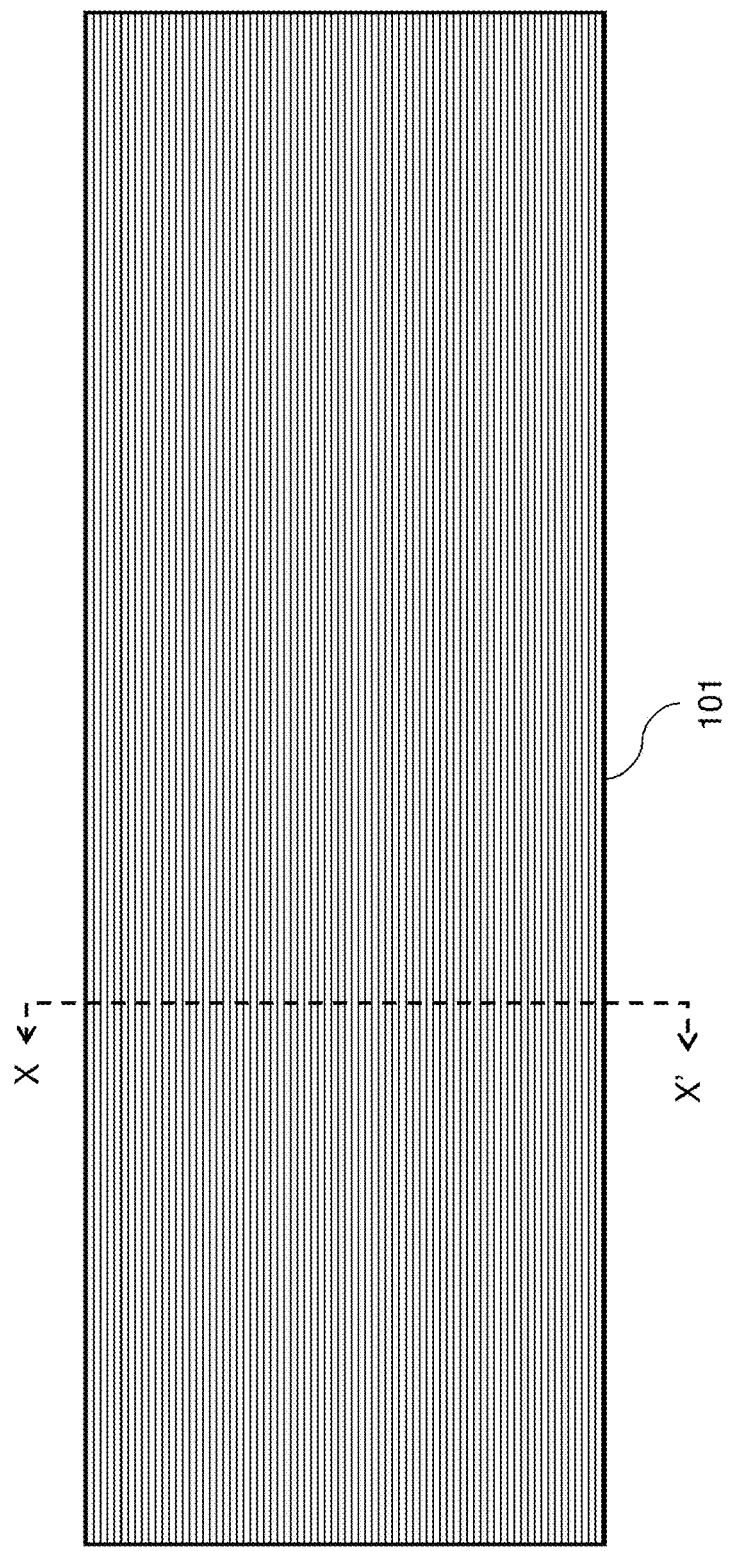
FIG. 1 shows a substrate, according to devices and methods herein.

The following detailed description of the devices and methods, as represented in the drawings, is not intended to limit the scope defined by the appended claims, but is merely representative of selected devices and methods. The following description is intended only by way of example, and simply illustrates certain concepts of the devices and methods, as disclosed and claimed herein.

As mentioned above, as the size of fin-type field effect transistors (FINFETs) continues to decrease and in order to continuously reduce the total area in FINFET technology, an isolation structure, referred to as Single-diffusion Break (SDB) may be implemented. Currently, the SDB can only be used to isolate transistors with the same polarity (e.g., between NFET to NFET or PFET to PFET) with no capability to isolate transistors of opposite polarity (i.e., between NFET and PFET). Disclosed herein is an SDB structure and method to enable the isolation between transistors of opposite types.

In view of the foregoing, disclosed herein are embodiments of a semiconductor structure having complementary transistors (i.e., an NFET and a PFET) having a Single-diffusion Break (SDB) for isolation between the complementary transistors. Generally, trenches are formed in a semiconductor fin to define at least one active device region within the semiconductor fin. A cavity with an enlarged bottom area is formed below each trench. Subsequently, an isolation layer can be deposited into the trench and cavity so as to fill the space within the trenches and cavity, thereby forming trench isolation regions and, particularly, SDB-type isolation regions. After the trench isolation regions are formed, source/drain areas can be formed within the active device region adjacent to the trench isolation regions.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can include, for example, ion implantation, etc.

FIGS. 1-11 illustrate the processing steps for forming a Single-diffusion Break (SDB) between complementary transistors, according to devices herein. In FIG. 1, a substrate 101 is provided. The substrate 101 may be any conventional semiconductor substrate such as, for example, a bulk silicon substrate or an active layer of semiconductor material of a semiconductor-on-insulator wafer (e.g., a silicon-on-insulator (SOI) wafer or any other suitable semiconductor-on-insulator wafer) (not shown). Such a semiconductor-on-insulator wafer can include a substrate (e.g., a silicon substrate or any other suitable substrate including, but not limited to, a silica glass substrate or a silicon carbide (SiC) substrate), an insulator layer (e.g., a buried oxide (BOX) layer or other suitable insulator layer) on the substrate, and a semiconductor layer on the insulator layer. In any case, the substrate 101 (or, if applicable, the semiconductor layer of the semiconductor-on-insulator wafer) can be made of a first semiconductor material (e.g., silicon or some other suitable monocrystalline semiconductor material).

Figure 2:
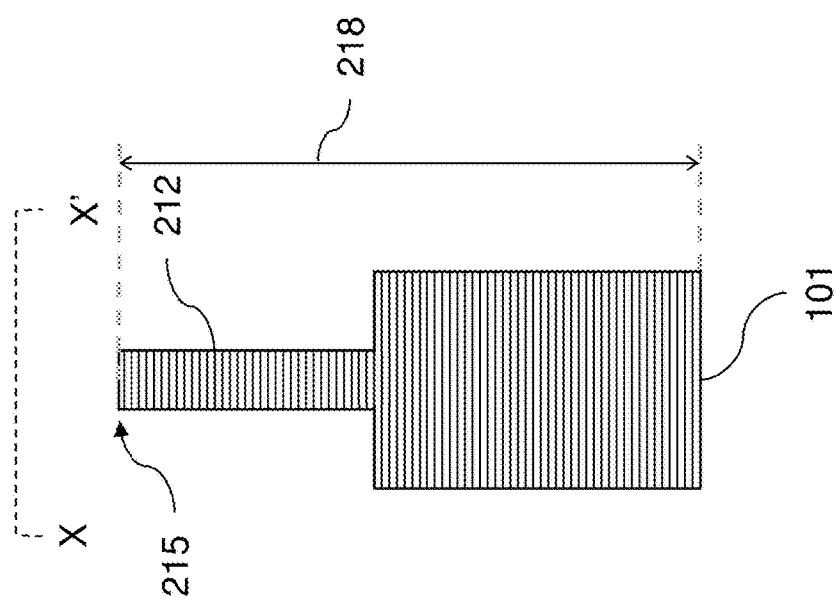
FIG. 2 is a cross-section of a fin for a fin-type field effect transistor (FINFET), according to devices and methods herein.

At least one semiconductor fin 212 is formed on the semiconductor wafer, as shown in FIG. 2. For purposes of this disclosure a semiconductor fin refers to a relatively tall and thin, elongated, semiconductor body that is essentially rectangular in shape. The semiconductor fin 212 can be formed the upper portion of the substrate 101 (or from the semiconductor layer of a semiconductor-on-insulator wafer) using, for example, conventional lithographic patterning techniques or sidewall image transfer (SIT) techniques. Thus, the semiconductor fin 212 will be made of the semiconductor material (e.g., silicon or some other suitable monocrystalline semiconductor material). In any case, the semiconductor fin 212 can have a top surface 215 and a height 218. It should be noted that the semiconductor fin 212 could be doped, either before or after formation, so that channel region(s), which will be located within the semiconductor fin 212, have appropriate type conductivity at a relatively low conductivity level. For example, for a P-type FINFET, the semiconductor fin 212 can have an N-conductivity; whereas, for an N-type FINFET, the semiconductor fin 212 can have a P-conductivity. Alternatively, the semiconductor fin 212 can be undoped.

Figure 3:
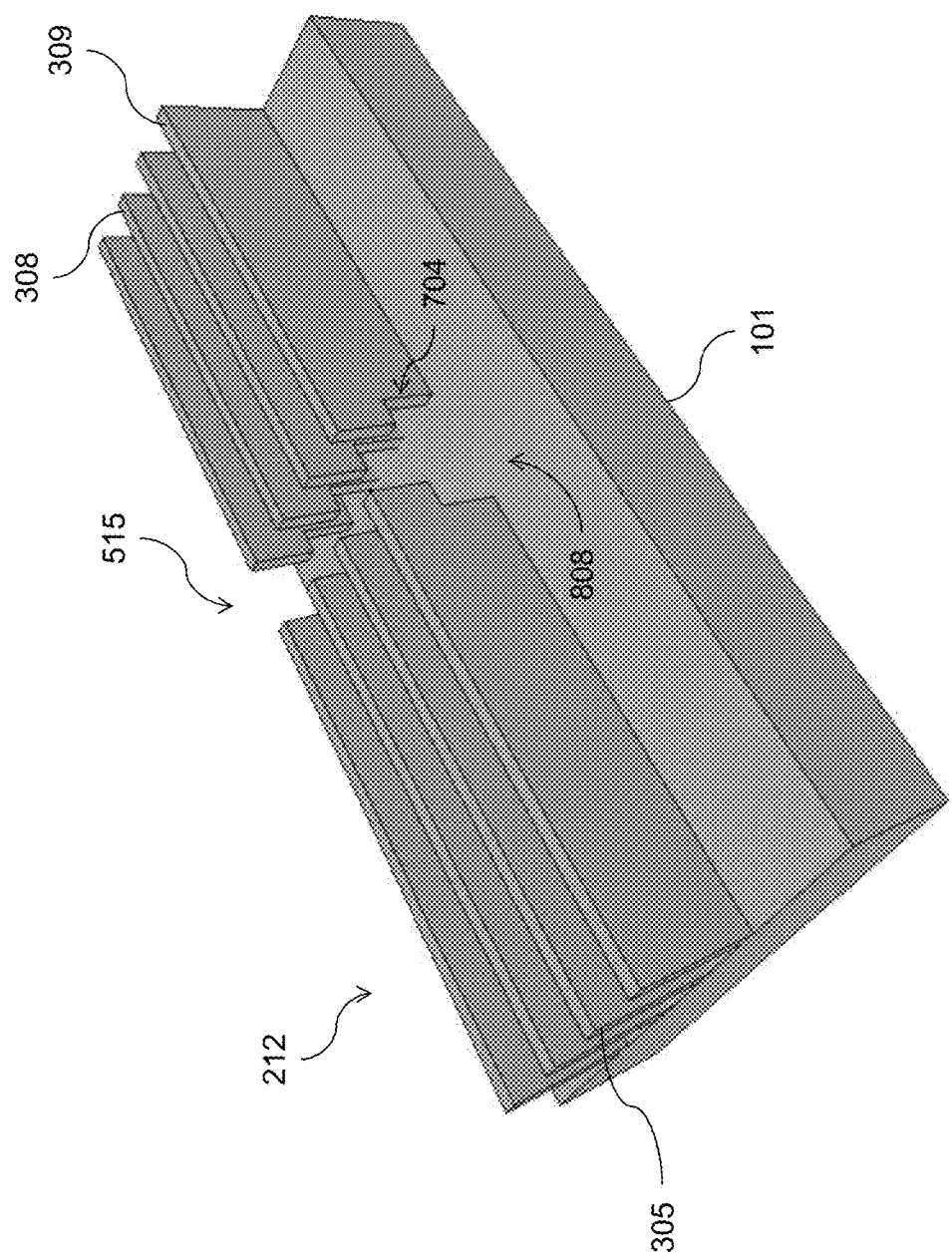
FIG. 3 is a perspective view of a substrate with fins, according to devices and methods herein.

Referring to FIG. 3, several semiconductor fins 212 can be formed in parallel on the substrate 101 (or from the semiconductor layer of a semiconductor-on-insulator wafer). The fins can include a middle fin 305 between two adjacent fins 308, 309. The middle fin 305 is in a location for a dummy gate (described in more detail below), and the two adjacent fins 308, 309 are in locations for gate conductors of adjacent complementary transistors, such as an NFET and a PFET (described in more detail below).

Figure 4:
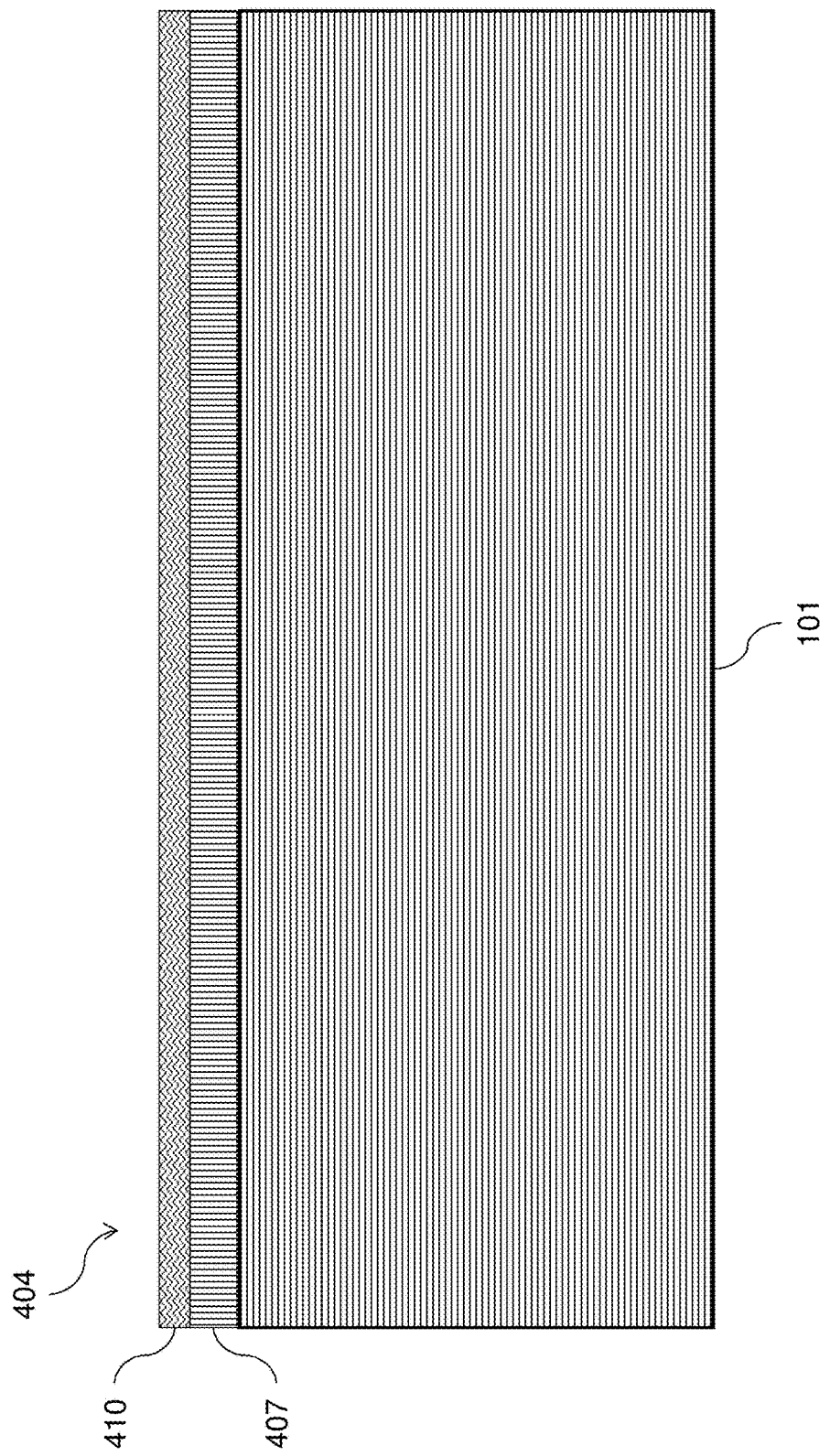
FIGS. 4-18 show a substrate illustrating the processing steps for a semiconductor structure, according to devices and methods herein.

In FIG. 4, a hardmask 404 can be applied to the top surface 215 of the semiconductor fins 212. The hardmask can be formed of any suitable material, whether now known or developed in the future, such as a metal or organic or inorganic (Si3N4, SiC, SiO2C (diamond)) hardmask, that has etch resistance greater than the substrate and insulator materials used in the remainder of the structure. As shown in FIG. 4, the hardmask 404 can include a nitride layer 407 and an oxide layer 410. When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a positive resist (illuminated portions remain) or negative resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Referring to FIGS. 5-9, portions of the semiconductor fins 212 are then removed to form asymmetric cuts in the semiconductor fins 212. The asymmetric cuts have relatively larger gaps between fin portions that are closest to the substrate 101, such as shown in FIG. 3.

Figure 5:
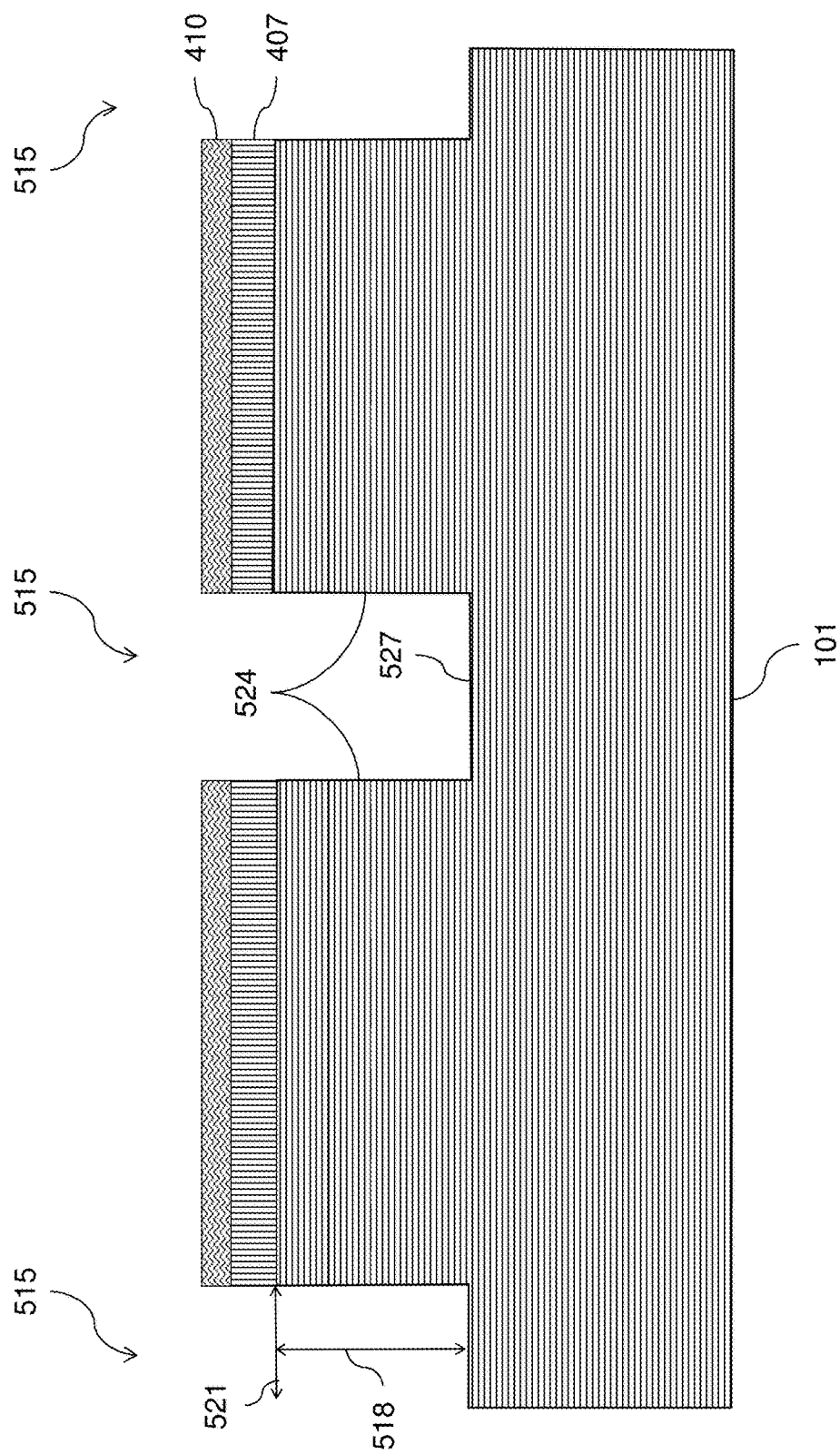

In FIG. 5, trenches 515 can be formed in the semiconductor fin 212. Specifically, conventional lithographic patterning and selective etch techniques can be performed to form trenches 515 in the semiconductor fin 212. The trenches 515 can have a first depth 518, as measured from the top surface 215 of the semiconductor fin 212, and a first width 521, as measured at the top surface 215 of the semiconductor fin 212 in a direction perpendicular to the width of the semiconductor fin 212. Additionally, each trench 515 can have opposing sidewalls 524 and a bottom 527 within the semiconductor fin 212 such that semiconductor surfaces are exposed at the opposing sidewalls 524 and the bottom 527. Each trench 515 can further cut across the full width of the semiconductor fin 212.

One or more conventional etch processes, such as a reactive ion etch (RIE), may be used to form the trenches 515, with each RIE process being tailored to the material of the feature being etched. Any suitable etch may be used to form the trenches 515. In one non-limiting example, the trenches 515 may have a first depth 518 of about 50-80 nm and a first width 521 of about 20-30 nm. It is contemplated that the present disclosure is not limited to the exemplary dimensions described herein, however, and any suitable width and depth may be used with the trenches 515, as appropriate.

Figure 6:
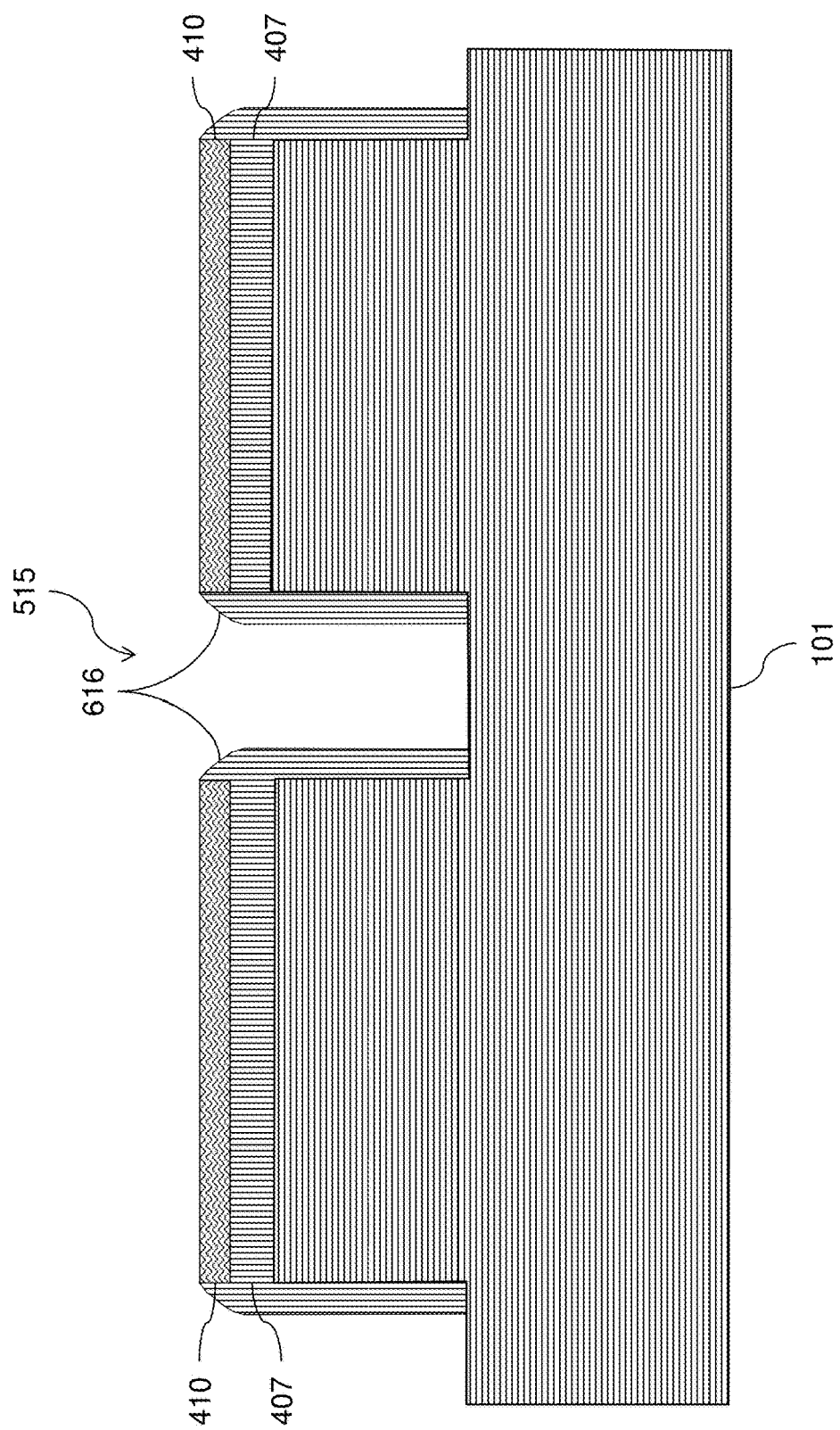

In FIG. 6, a thin nitride layer has been deposited on the semiconductor fins 212 and etched back to form nitride spacers 616. For purposes herein, "sidewall spacers" are structures that are well-known to those ordinarily skilled in the art and are generally formed by depositing or growing a conformal insulating layer and then performing a directional etching process (anisotropic) that etches material from horizontal surfaces at a greater rate than its removes material from vertical surfaces, thereby leaving insulating material along the vertical sidewalls of the structures. This material left on the vertical sidewalls is referred to as sidewall spacers. In one non-limiting example, the nitride spacers 616 may have a thickness ranging from approximately 1 nm to approximately 5 nm (e.g., a thickness of approximately 3 nm).

Figure 7:
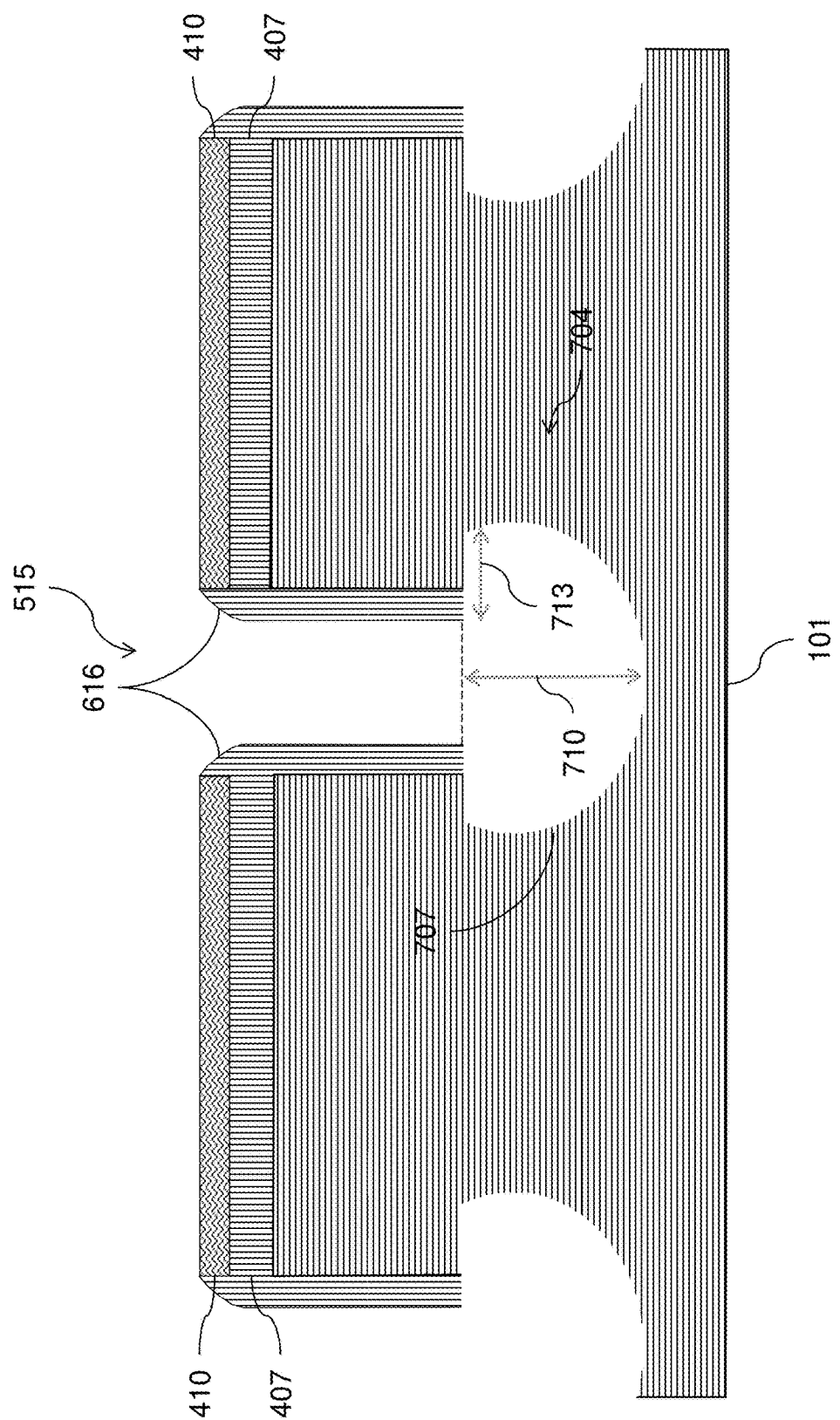

In FIG. 7, asymmetric trenches 704 are formed in the substrate 101 through the trenches 515 formed by the asymmetric cuts. Specifically, a cavity 707 is cut below each of the trenches 515. The cavity 707 has a second depth 710 as measured from the bottom 527 of the trench 515 and a lateral undercut 713 measured from the edge of the nitride spacers 616. In one non-limiting example, the cavity 707 may have a second depth 710 of about 10-15 nm and a lateral undercut 713 of about 5-10 nm. It is contemplated that the present disclosure is not limited to the exemplary dimensions described herein, however, and any suitable width and depth may be used with the cavity 707, as appropriate.

Figure 8:
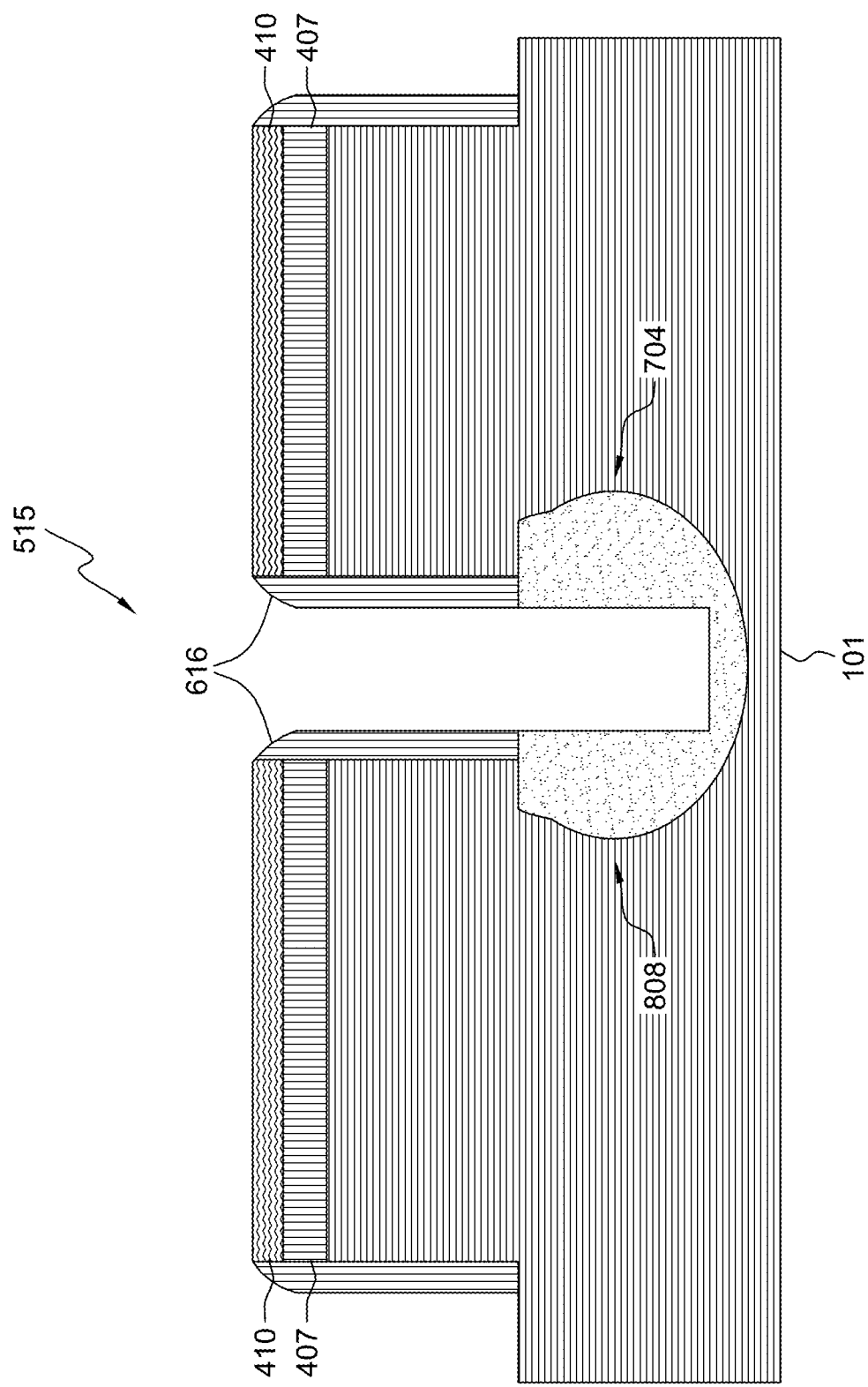

The cavity 707 can be formed using an isotropic etch process on the bottom of the trench 515. Alternatively, as shown in FIG. 8, anisotropic etching can be used to extend the depth of the trench 515 followed by oxidation of the substrate 101, in order to enlarge the bottom portion 808.

Figure 9:
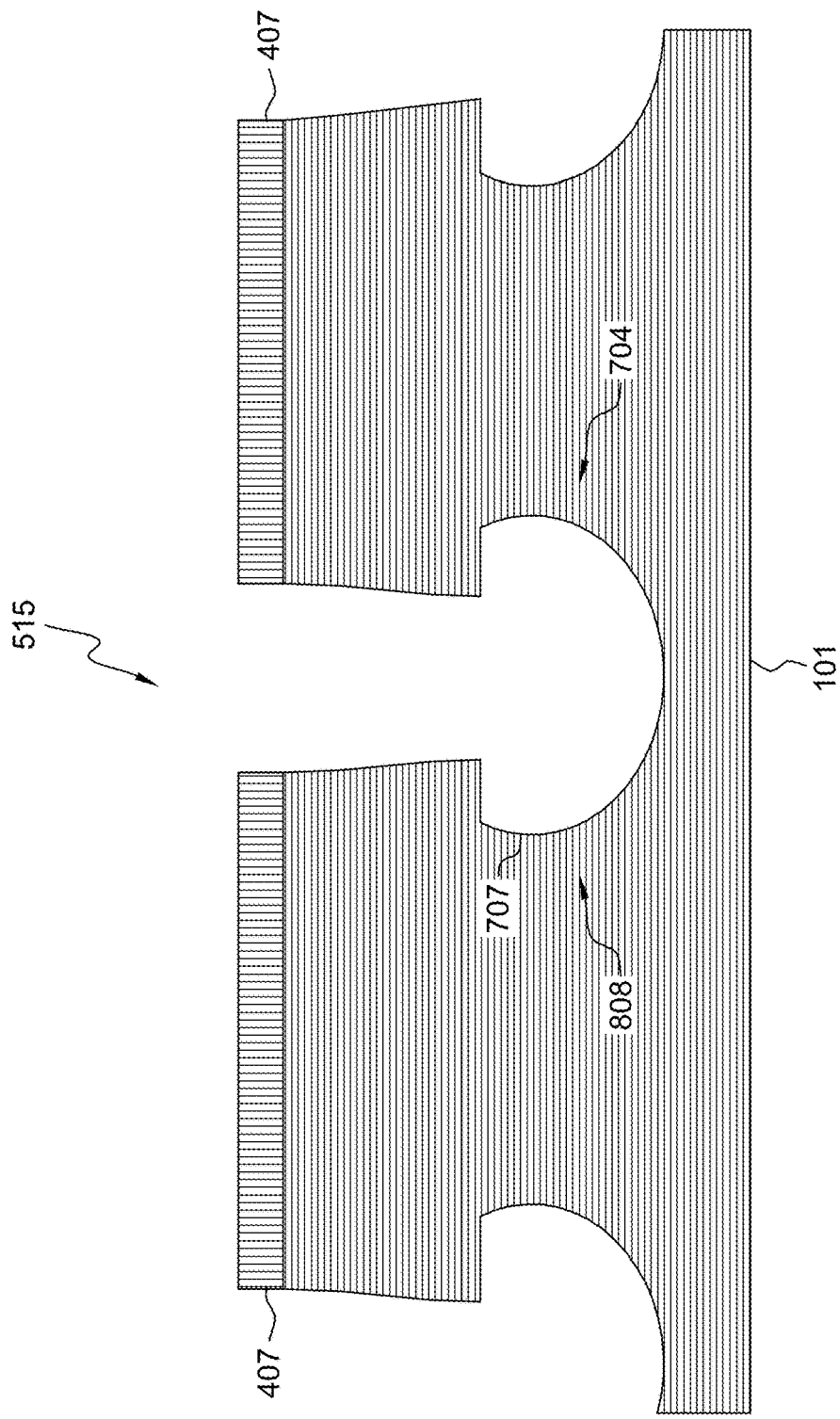

In FIG. 9, the nitride spacers 616 and the oxide layer 410 are removed. It is desirable to use a wet etch that can remove Si and oxide in the undercut bottom portion 808 as well as between the semiconductor fins 212, as shown in FIG. 3. (Note FIG. 3 shows the same structure as FIG. 9, in perspective view.) The wet etching may be accomplished by anisotropic etchants, including any of ethylenediamine pyrocatechol (EDP), potassium hydroxide/isopropyl alcohol (KOH/IPA), tetramethylammonium hydroxide (TMAH), and ammonia hydroxide.

Figure 10:
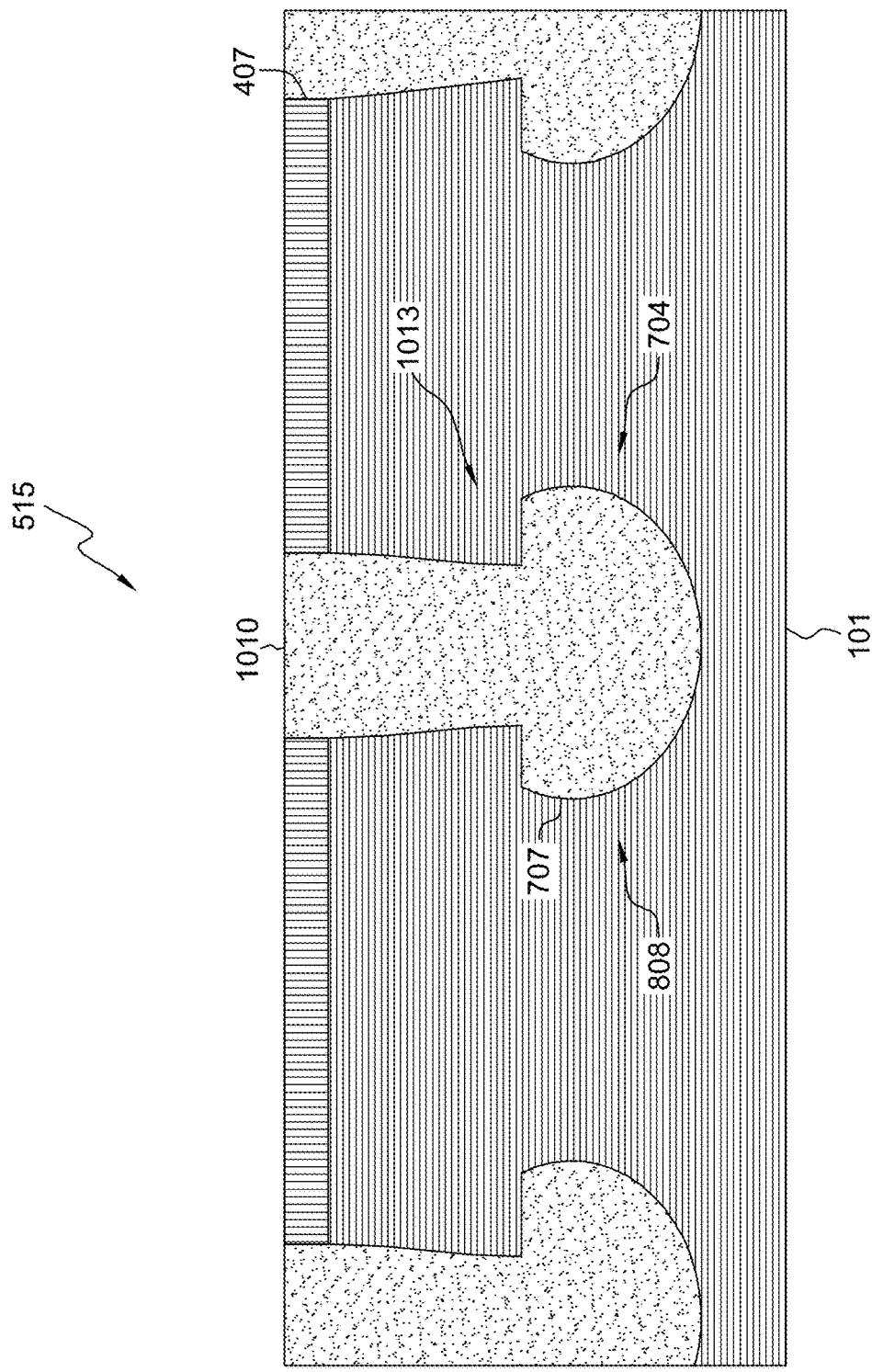

As shown in FIG. 10, an isolation layer 1010 can be deposited, so as to fill the trenches 515 and the cavity 707 to form a single-diffusion break (SDB) 1013. The isolation layer 1010 is an insulator, such as an oxide, and can be, for example, a layer of silicon dioxide that is deposited, for example, by flowable chemical vapor deposition (FCVD). Alternatively, the isolation layer 1010 can be one or more layers of silicon dioxide, silicon nitride, silicon carbon nitride, silicon boron carbon nitride, silicon oxycarbide, or any other suitable isolation material. Next, a polishing process (e.g., a CMP process) can be performed.

Figure 11:
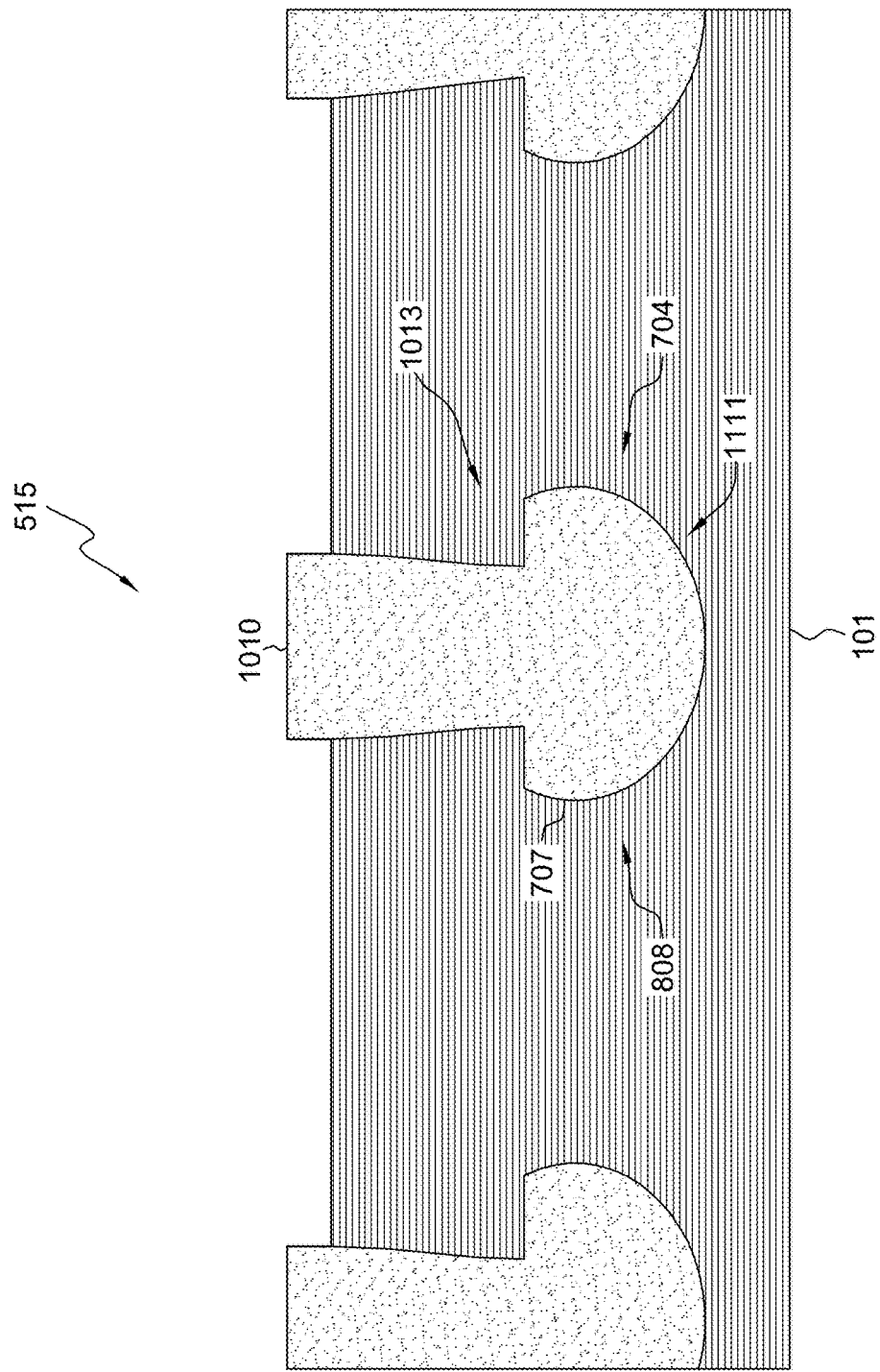

In FIG. 11, a fin-revealing ox-etch can be performed and the hardmask 404 can be removed. The single-diffusion break (SDB) 1013 has a large bottom 1111 that is self-aligned.

FIGS. 12-18 illustrate the processing steps for forming a Complementary Metal-Oxide-Semiconductor (CMOS) device having a Single-Diffusion Break (SDB) between the complementary transistors, according to devices herein.

Figure 12:
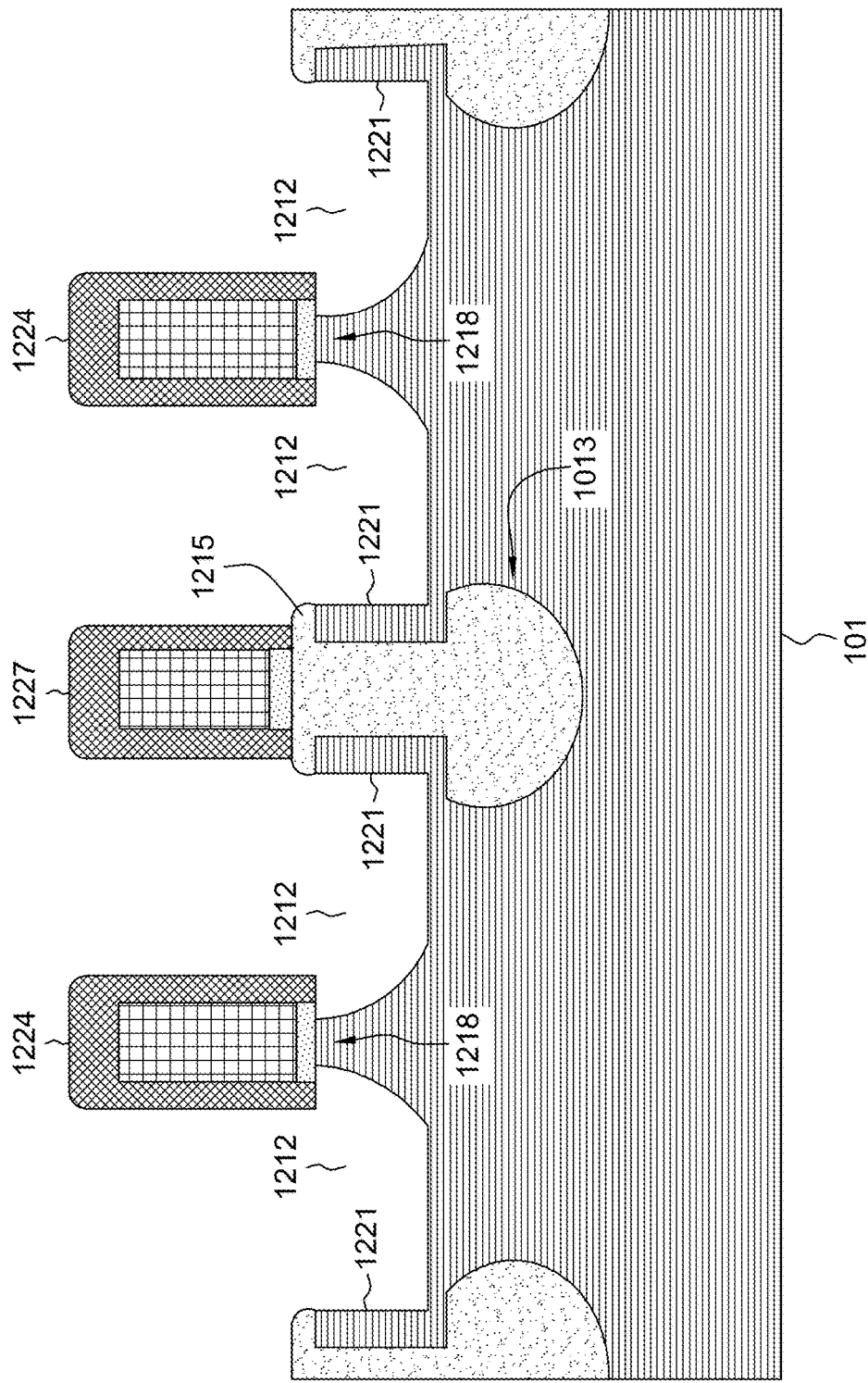

In FIG. 12, deep STI can be performed to form isolation trenches and create source/drain recesses 1212 for adjacent transistors. Specifically, one or more anisotropic etch processes, such as reactive ion etch (RIE), can be performed to etch source/drain recesses 1212 into each semiconductor fin 212 forming a mushroom top 1215 on the single-diffusion break (SDB) 1013. The mushroom top 1215, sometimes referred to as a T-top, will shadow portions of the substrate 101 during RIE, leaving sidewalls 1221, which provide silicon for epitaxial growth for the source/drain regions described below. Each source/drain recess 1212 will have a first side adjacent to a channel region 1218 and a second side opposite the first side adjacent to the sidewall 1221. Note that the depth of the source/drain recesses 1212 cannot be deeper than the top of the cavity 707 for the large bottom 1111 of the single-diffusion break (SDB) 1013. Otherwise, epitaxial growth will not occur for the source/drain regions as described below.

After the trench isolation recesses are formed, active device regions can be used to form corresponding FINFETs. That is, the source/drain regions of different transistors are formed in the substrate 101 on opposite sides of the channel regions 1218. The single-diffusion break 1013 is between two of the source and drain regions of different ones of the complementary transistors.

Figure 13:
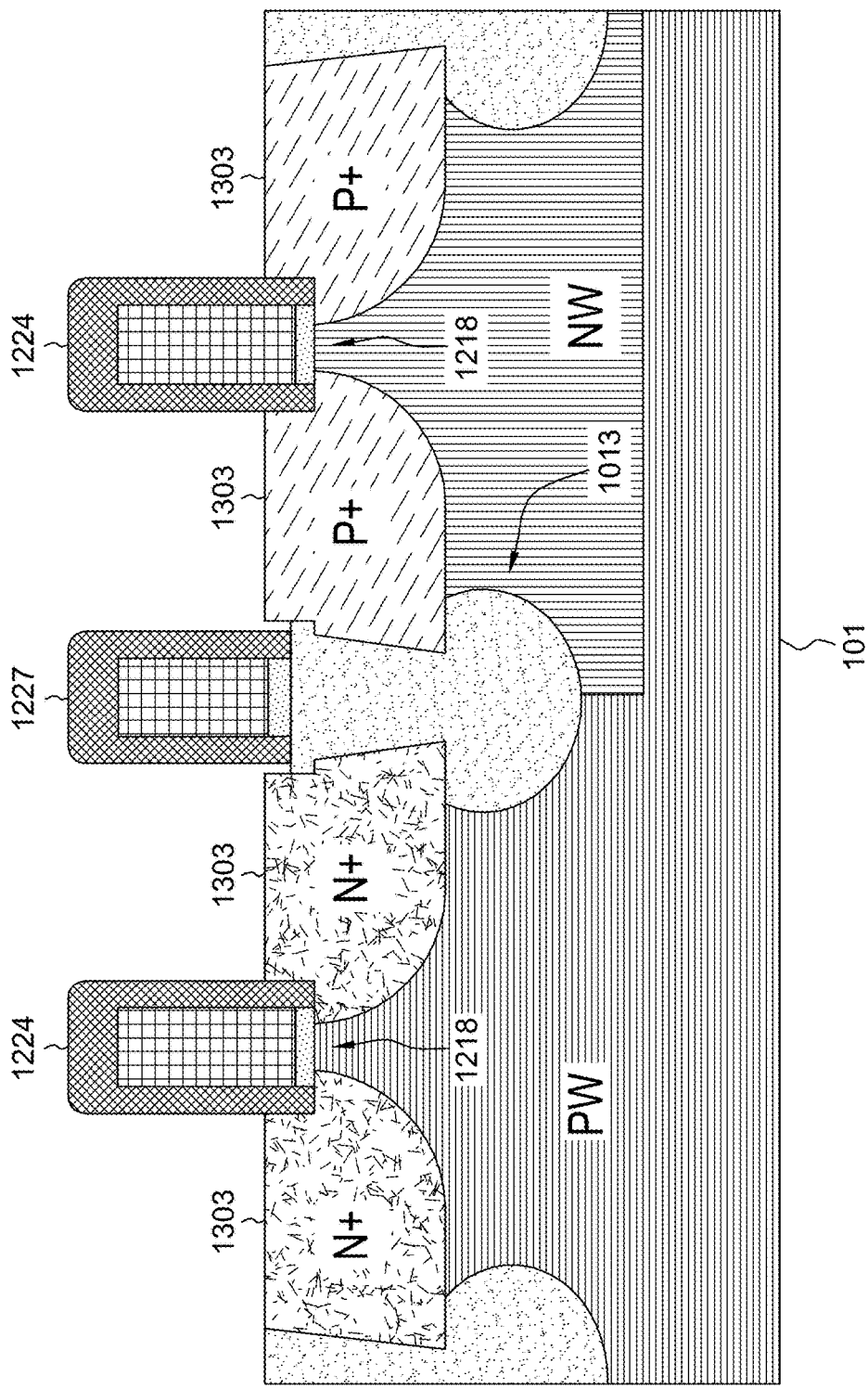

In FIG. 13, source/drain regions 1303 can be formed within the source/drain recesses 1212. The source/drain regions 1303 can be formed, for example, by epitaxially growing an additional semiconductor layer in the source/drain recesses 1212. The additional semiconductor layer can be in-situ doped so as to have the appropriate type conductivity at a relatively high conductivity level. For example, for a P-type FINFET, the additional semiconductor layer can be in-situ doped with a P-type dopant so as to have P+ conductivity; whereas, for an N-type FINFET, the additional semiconductor layer can be in-situ doped with an N-type dopant so as to have N+ conductivity. The additional semiconductor layer can be made of the same first semiconductor material as that used for the semiconductor fin 212 (e.g., silicon). Alternatively, the additional semiconductor layer can be made of a second semiconductor material that is different from the first semiconductor material. The type of second semiconductor material used may be preselected to enhance FINFET performance and may vary depending upon whether the FINFET being formed is a P-type FINFET or an N-type FINFET. For example, for a P-type FINFET, the additional semiconductor layer can be a silicon germanium (SiGe) layer, which will enhance majority charge carrier mobility within the channel region of the P-type FINFET and, thereby enhance performance. For an N-type FINFET, the additional semiconductor layer can be a silicon carbide (SiC) layer, which will enhance majority charge carrier mobility within the channel region of the N-type FINFET and, thereby enhance performance. P-well (PW) and N-well (NW) areas are defined by appropriate doping.

To form the FINFET(s), gate structures can be formed on the partially completed structure shown in FIG. 12. The gate structures can include first gate structure(s) 1224 and second gate structures 1227. Each first gate structure 1224 can be on the top surface and opposing sidewalls of the semiconductor fin 212 at a channel region 1218 (i.e., essentially centered between a pair of adjacent trench isolation regions). Each second gate structure 1227 can be on the top surface of an SDB 1013.

The gate structures 1224/1227 can be sacrificial gate structures, which are to be used as placeholders for subsequent replacement metal gate (RMG) processing. To form sacrificial gate structures, a sacrificial gate stack can be formed on the partially completed structure. The sacrificial gate stack can include, for example: a thin sacrificial oxide layer; a sacrificial polysilicon layer, a sacrificial amorphous silicon layer or a sacrificial layer of some other suitable sacrificial material on the sacrificial oxide layer; and a sacrificial gate cap layer, such as a sacrificial silicon nitride gate cap layer. Lithographic patterning and etch processes can then be performed in order to form, from this sacrificial gate stack, sacrificial gates, each having a sacrificial gate cap.

Alternatively, the gate structures 1224/1227 can be conventional gate-first gate structures. To form gate-first gate structures, a gate stack can be formed on the partially completed structure. The gate stack can include, for example: a gate dielectric layer, such as a silicon dioxide gate dielectric layer; a gate conductor layer, such as a polysilicon gate conductor layer, on the gate dielectric layer; and a gate cap layer, such as a silicon nitride gate cap layer, on the gate conductor layer. Lithographic patterning and etch processes can then be performed in order to form, from this gate stack, gate-first gates, each having a gate cap.

Following formation of the source/drain regions 1303 and the gate structures 1224/1227, additional processing can be performed in order to complete the semiconductor structure with one or more FINFETs.

Figure 14:
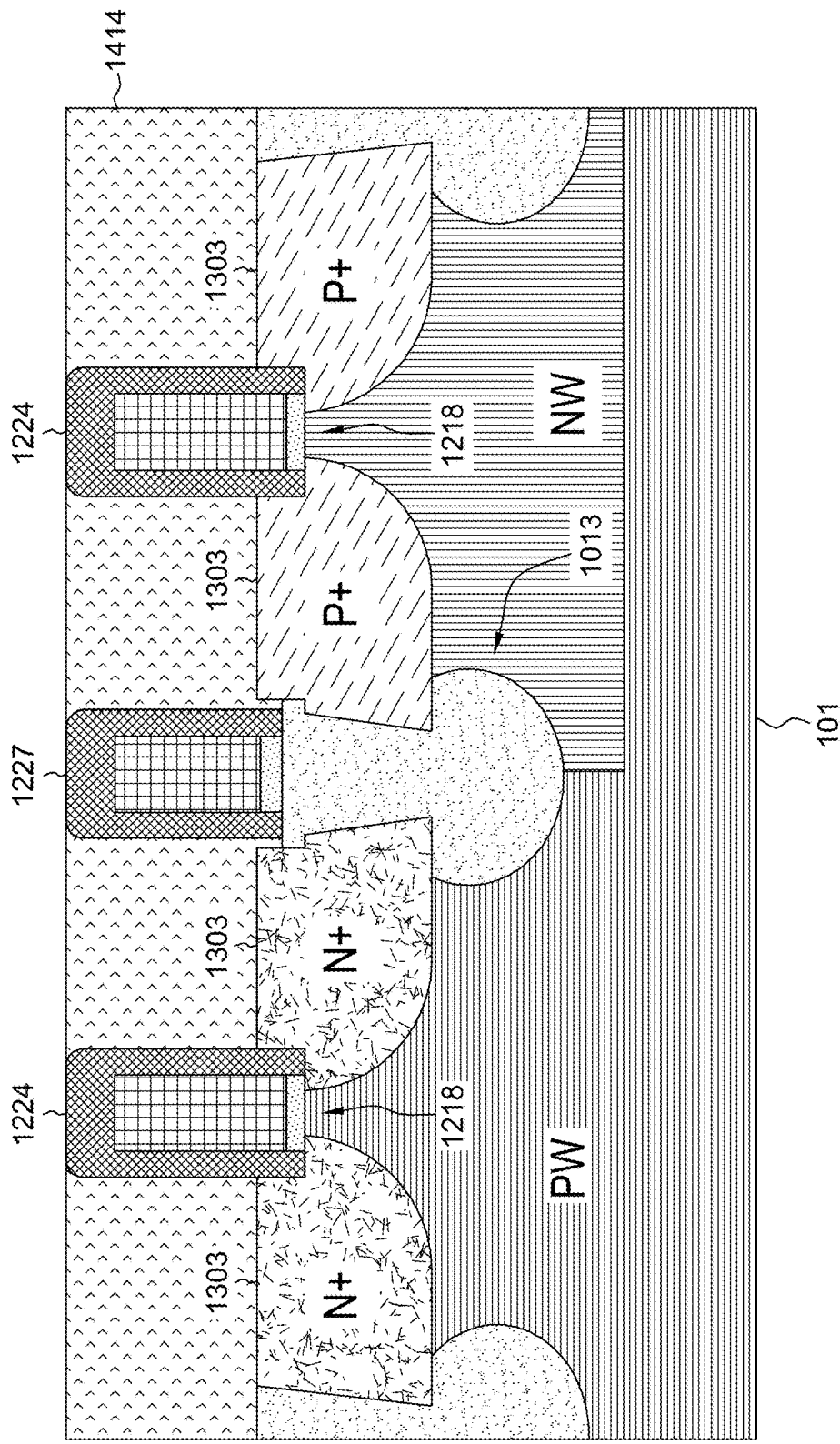

For example, referring to FIG. 14, a blanket interlayer dielectric (ILD) layer 1414 can be deposited over the partially completed structures. The ILD layer 1414 can be, for example, a silicon oxide layer or one or more layers of any suitable ILD material(s) (e.g., silicon dioxide, silicon nitride, borophosphosilicate glass (BPSG), tetraethyl orthosilicate (TEOS), fluorinated tetraethyl orthosilicate (FTEOS), etc.). Additionally, if the gate structures 1223/1227 previously formed were sacrificial gate structures as opposed to gate-first gate structures, a polishing process (e.g., a CMP process) can be performed to expose the tops of the sacrificial gates (i.e., to remove the sacrificial gate caps) from each of the gate structures 1224/1227. Then, the sacrificial gates can be selectively removed and replaced with replacement metal gates (RMGs).

Figure 15:
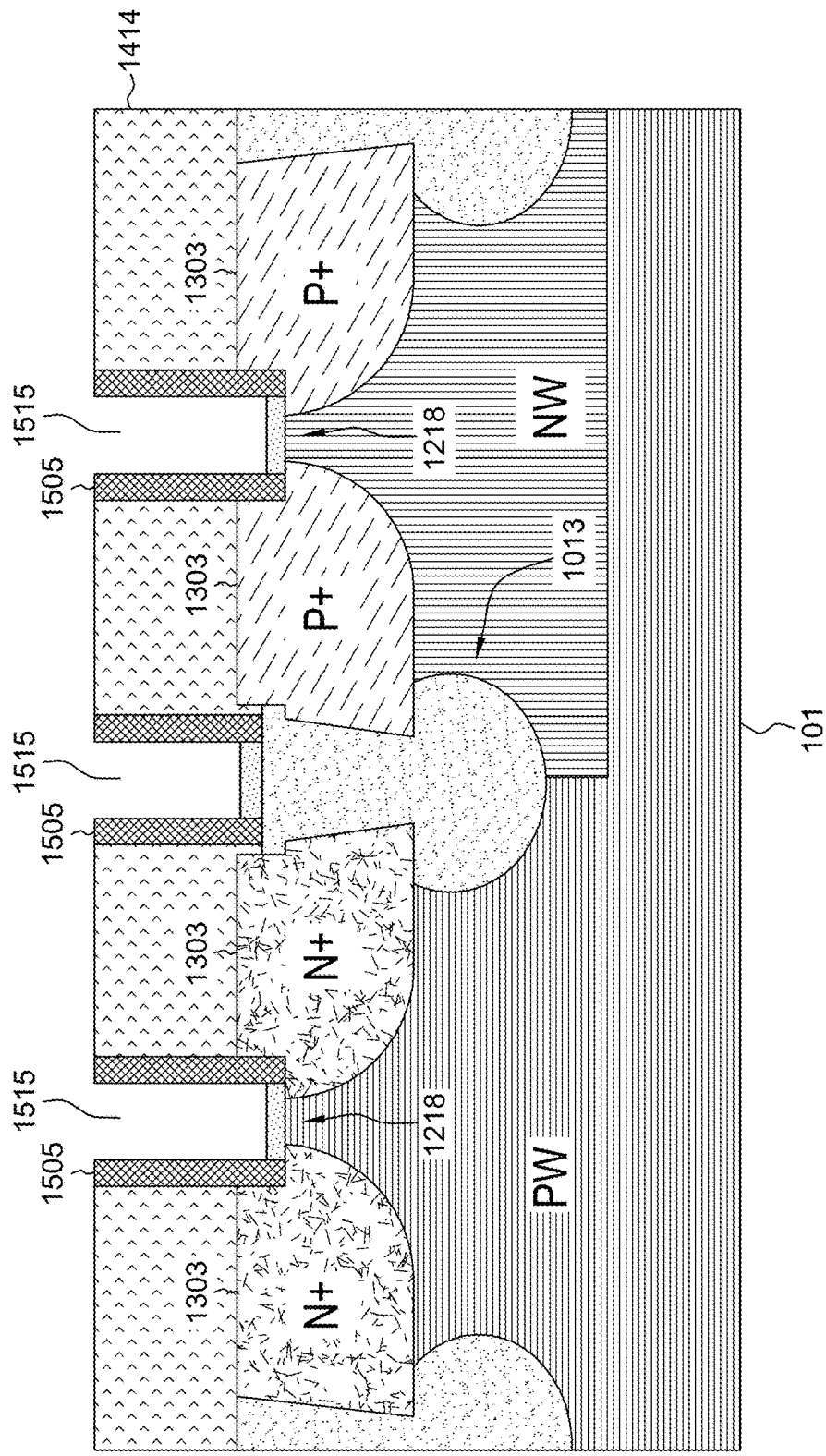

Specifically, as shown in FIG. 15, the sacrificial material of the sacrificial gates can be selectively etched over the semiconductor material of the semiconductor fin 212 as well as over the adjacent dielectric materials of gate sidewall spacers 1505 and the ILD layer 1414, thereby creating gate openings 1515 in the ILD layer 1414. It should be noted that, since each gate structure was formed adjacent to the top surface and opposing sides of the semiconductor fin 212 at a channel region 1218, the corresponding gate openings will expose the top surface and opposing sides of the semiconductor fin 212 at a channel region 1218. In any case, each gate opening 1515 will have sidewalls lined with a gate sidewall spacer 1505.

Figure 16:
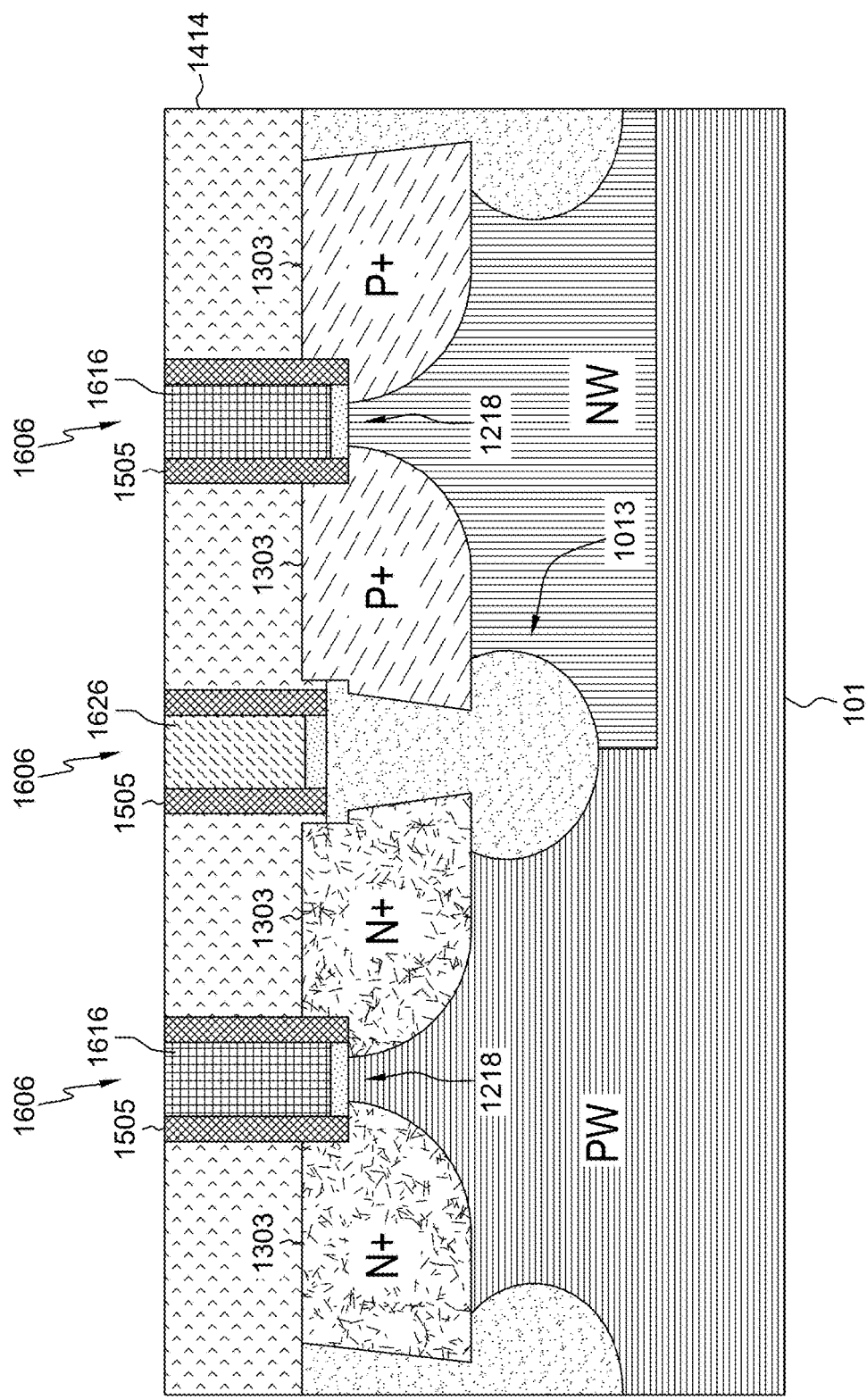

In FIG. 16, gate structure 1606 can be formed including functional replacement metal gates (RMGs) 1616 for the FINFET(s) in the gate opening(s) adjacent to the top surface and opposing sides the semiconductor fin 212 at the channel region(s) 1218 and non-functional RMGs 1626 above the single-diffusion break (SDB) 1013.

Exemplary techniques for forming RMGs include conformally depositing a gate dielectric layer so as to line the gate openings and, then, depositing a stack of gate conductor layers on the gate dielectric layer in order to fill the gate openings. The stack of gate conductor layers can include, for example, at least one conformal work function metal layer and a conductive fill material layer on the conformal work function metal layer(s).

The conformal gate dielectric layer could be a silicon dioxide gate dielectric layer. Alternatively, the conformal gate dielectric layer can be a high-K gate dielectric layer. The high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The conformal work function metal can include a metal material or metal alloy material that is preselected in order to achieve the optimal gate conductor work function given the conductivity type of the FET. For example, the optimal gate conductor work function of an NFET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a PFET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The conductive fill material layer can be a blanket layer of a metal or a metal alloy, such as tungsten, a tungsten alloy (e.g., tungsten silicide or titanium tungsten), cobalt, aluminum, or any other suitable metal or metal alloy.

In any case, after the RMG materials are deposited so as to fill the gate openings 1515, a polishing process (e.g., a CMP process) can be performed in order to remove the RMG materials from above the top surface of the ILD layer 1414. Then, the RMG materials within the gate openings 1515 can be etched back (i.e., recessed). After the RMG materials are etched back, a dielectric cap layer (e.g., a silicon nitride cap layer) can be deposited and polished (e.g., by CMP) in order to form dielectric caps for the RMGs.

It should be understood that the techniques described above for forming the RMGs are offered for illustration purposes only and are not intended to be limiting. Alternatively, any other suitable technique for forming RMG could be used.

Figure 17:
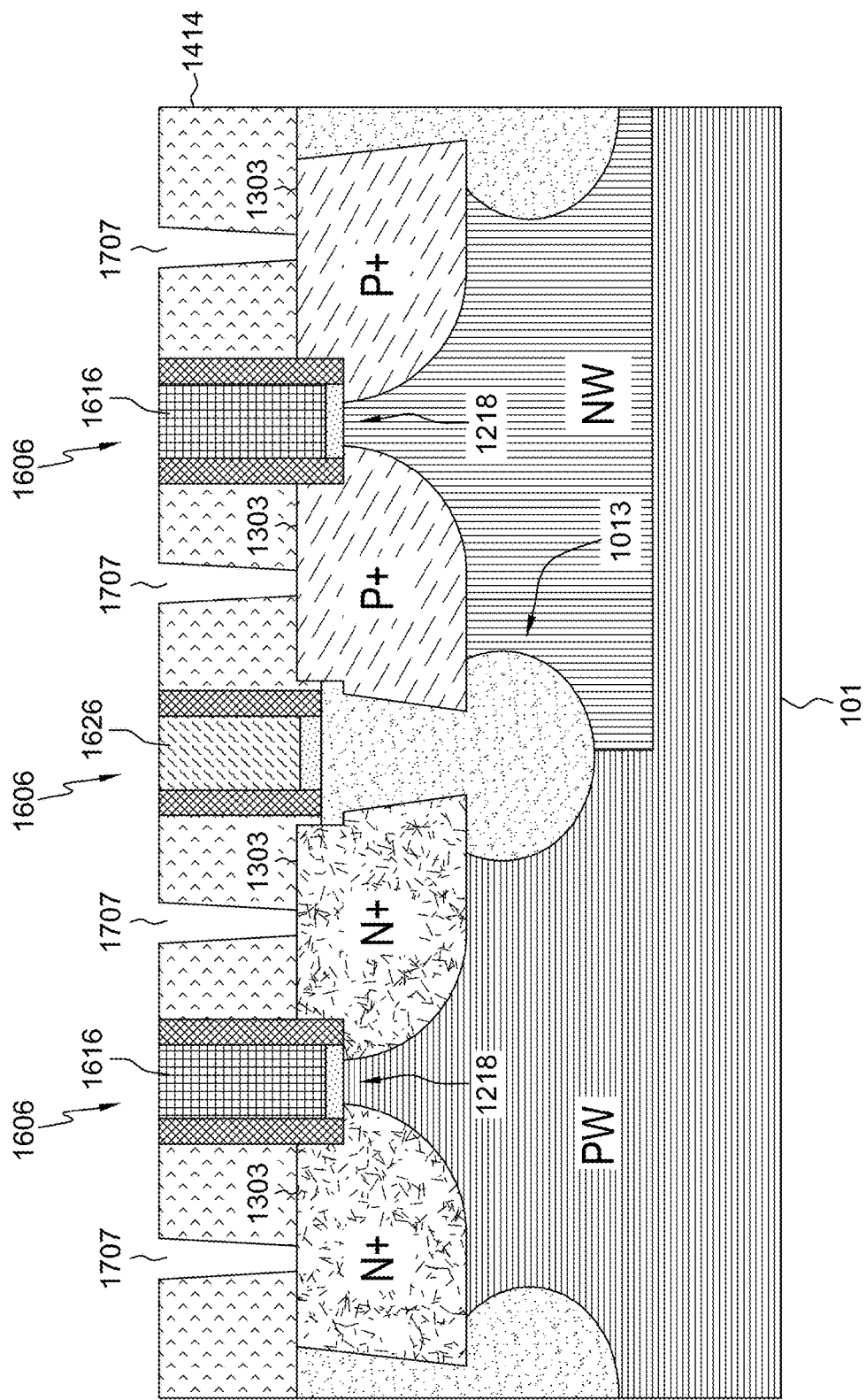
Figure 18:
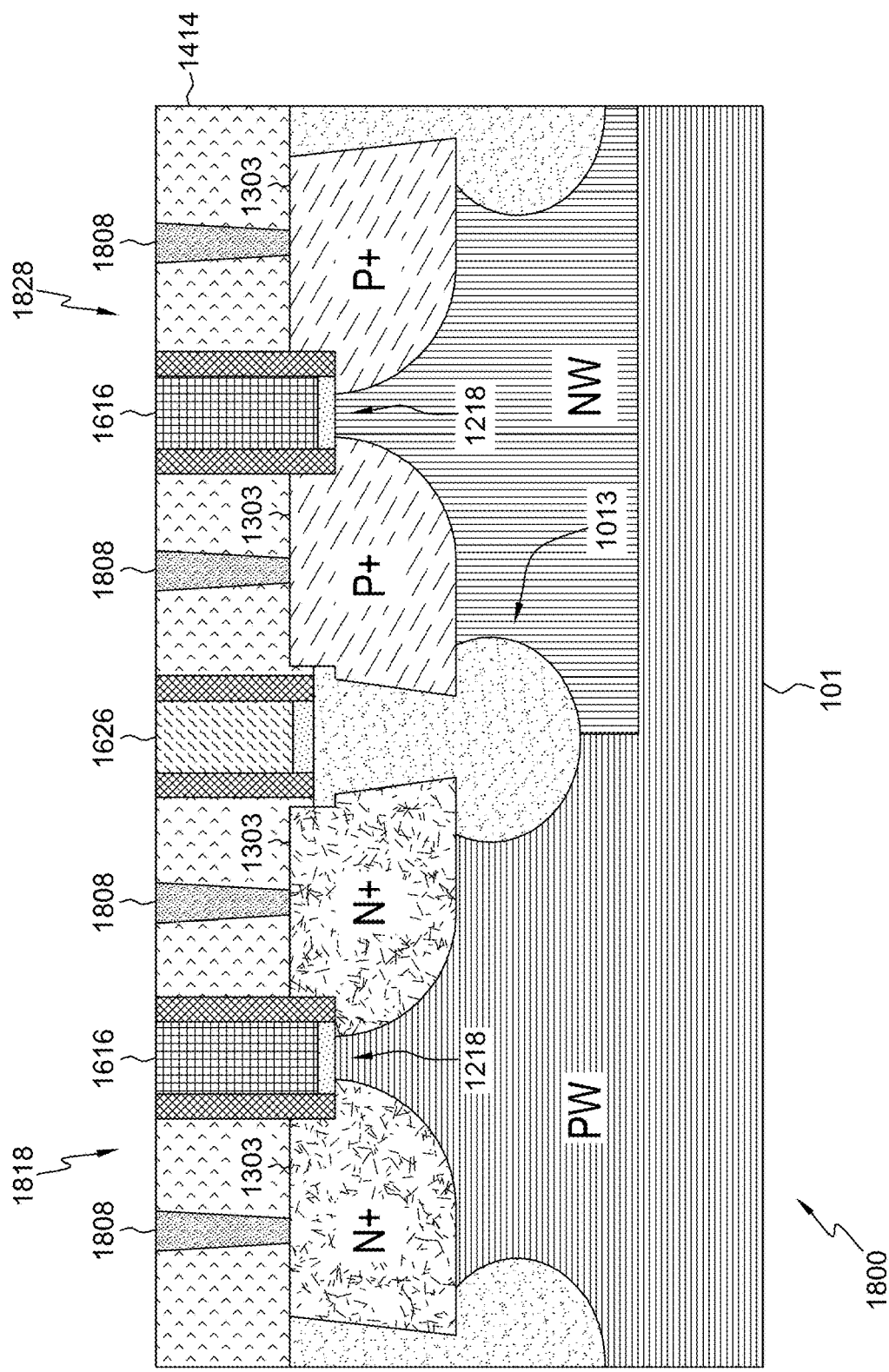

Next, referring to FIGS. 17 and 18, lithographic patterning and etch processes can be performed in order to form contact openings 1707 that extend essentially vertically through the ILD layer 1414 to the top surfaces of the source/drain regions 1303. Then, source/drain contacts 1808 (also referred to in the art as metal plugs) can be formed in the contact openings 1707 (see FIG. 18). These contacts 1808 can be formed, for example, by optionally depositing one or more conformal layers such as a conformal adhesive layer (e.g., a titanium adhesive layer or other suitable adhesive layer) and/or a conformal barrier layer (e.g., titanium nitride barrier layer or other suitable barrier layer) to line the contact openings and, then, depositing a conductor and, particularly, a metal or metal alloy (e.g., a tungsten, cobalt, aluminum or any other suitable metal plug material) to fill the remaining spaces within the contact openings.

Also disclosed herein are embodiments of a semiconductor structure 1800 that includes one or more fin-type field effect transistors (FINFETs) 1818, 1828 and a single-diffusion break (SDB) 1013 between the FINFETs 1818, 1828. Each of the FINFETs 1818, 1828 is in a semiconductor fin 212 and has a defined active device region(s) for the FINFET(s).

The semiconductor structure 1800 can include a semiconductor fin 212 on a semiconductor substrate 101. For example, the semiconductor fin 212 can be formed from an upper portion of a bulk semiconductor wafer, as illustrated. Alternatively, the semiconductor fin 212 can be formed from a semiconductor layer of a semiconductor-on-insulator wafer (e.g., a silicon-on-insulator (SOI) wafer or any other suitable semiconductor-on-insulator wafer). In any case, the semiconductor fin can be made of a first semiconductor material (e.g., silicon or some other suitable monocrystalline semiconductor material). For purposes of this disclosure a semiconductor fin refers to a relatively tall and thin, elongated, semiconductor body that is essentially rectangular in shape.

The semiconductor structure 1800 can further include trench isolation regions and, particularly, SDB-type isolation regions 1013 located within the semiconductor fin 212. Some of the trench isolation regions can define active device region(s) in particular source/drain regions 1303 within the semiconductor fin 212. That is, within the semiconductor fin 212, an active device region can be positioned laterally between each pair of trench isolation regions.

Each SDB-type isolation region can include an asymmetric trench that extends essentially vertically into the semiconductor fin 212 and further cuts across the full width of the semiconductor fin 212. Each asymmetric trench can have a lower portion and an upper portion above the lower portion. The lower portion includes a cavity 707 forming an enlarged bottom 1111.

An isolation layer 1010 can fill the asymmetric trench including the lower portion. The isolation layer 1010 can be, for example, a layer of silicon dioxide. Alternatively, the isolation layer 1010 can be one or more layers of silicon dioxide, silicon nitride, silicon carbon nitride, silicon boron carbon nitride, silicon oxycarbide, or any other suitable isolation material.

The semiconductor structure 1800 can further include at least one transistor 1818, 1828 and, particularly, at least one FINFET. Each FINFET 1818, 1828 can include source/drain regions 1303; a channel region 1218 positioned laterally between the source/drain regions 1303; and a gate structure 1606 adjacent to the top surface and opposing sidewalls of the semiconductor fin 212 at the channel region 1218.

Specifically, the channel region 1218 can be within a corresponding active device region in the semiconductor fin 212. The active device region or at least the channel region 1218 therein can have appropriate type conductivity at a relatively low conductivity level. For example, for a P-type FINFET, the channel region 1218 can be doped so as to have an N-conductivity; whereas, for an N-type FINFET, the channel region 1218 can be doped so as to have a P-conductivity. Alternatively, the channel region 1218 can be undoped.

The gate structure 1606 can be a replacement metal gate (RMG) structure. Alternatively, the gate structure 1606 can be a gate-first gate structure. In any case the gate structure 1606 can have a gate sidewall spacer 1505. It should be noted that, given the method used to form the semiconductor structure 1800, as described in detail above, the semiconductor structure will also include non-functioning RMGs 1626 above each of the single-diffusion break (SDB) 1013.

The source/drain regions 1303 can be on opposite sides of the gate structure 1606. Each source/drain region 1303 can include a source/drain recess having a first side, a second side opposite the first side, and a bottom. The first side can be positioned laterally adjacent to the channel region 1218. The second side can be positioned laterally adjacent to the single-diffusion break (SDB) 1013. The bottom can be at a predetermined depth, which is some distance above the bottom of the semiconductor fin 212. Optionally, the second side of the source/drain recess can actually abut the single-diffusion break (SDB) 1013, as illustrated. Each source/drain region 1303 can further include an additional semiconductor layer within the source/drain recess.

The additional semiconductor layer can be an epitaxial semiconductor layer that is in-situ doped so as to have the appropriate type conductivity at a relatively high conductivity level. For example, for a P-type FINFET, the additional semiconductor layer can be in-situ doped with a P-type dopant so as to have P+ conductivity; whereas, for an N-type FINFET, the additional semiconductor layer can be in-situ doped with an N-type dopant so as to have N+ conductivity.

The additional semiconductor layer can be made of the same first semiconductor material as that used for the semiconductor fin 212 and the semiconductor layer (e.g., silicon). Alternatively, the additional semiconductor layer can be made of a second semiconductor material that is different from the first semiconductor material. The type of second semiconductor material used may be preselected to enhance FINFET performance and may vary depending upon whether the FINFET being formed is a P-type FINFET or an N-type FINFET. For example, for a P-type FINFET, the additional semiconductor layer can be a silicon germanium (SiGe) layer, which will enhance majority charge carrier mobility within the channel region of the P-type FINFET and, thereby enhance performance. For an N-type FINFET, the additional semiconductor layer can be a silicon carbide (SiC) layer, which will enhance majority charge carrier mobility within the channel region of the N-type FINFET and, thereby enhance performance.

The semiconductor structure 1800 can further include a blanket interlayer dielectric (ILD) layer 1414 on the top surface of each of the source/drain regions 1303 and laterally surrounding the gate structures 1606. The ILD layer 1414 can be, for example, a silicon oxide layer or one or more layers of any suitable ILD material(s) (e.g., silicon dioxide, silicon nitride, borophosphosilicate glass (BPS G), tetraethyl orthosilicate (TEOS), fluorinated tetraethyl orthosilicate (FTEOS), etc.).

The semiconductor structure 1800 can further includes source/drain contacts 1808 (also referred to in the art as metal plugs). Specifically, the semiconductor structure 1800 can include contact openings 1707 that extend essentially vertically through the ILD layer 1414 to the top surfaces of the source/drain regions 1303. Contacts 1808 within the contact openings can include one or more conformal layers such as a conformal adhesive layer (e.g., a titanium adhesive layer or other suitable adhesive layer) and/or a conformal barrier layer (e.g., titanium nitride barrier layer or other suitable barrier layer), which line the contact openings. The contacts 1808 can further include a conductor and, particularly, a metal or metal alloy (e.g., a tungsten, cobalt, aluminum or any other suitable metal plug material), which fills the remaining space within the contact openings.

In the embodiments of the method and semiconductor structure described above, the FINFET(s) 1818, 1828 can be N-type FINFET(s) or P-type FINFET(s). As discussed above, for an N-type FINFET, the channel region can have P-type conductivity (or can be undoped) and the source/drain regions can have N-type conductivity; whereas, for a P-type FINFET, the channel region can have N-type conductivity (or can be undoped) and the source/drain regions can have P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

Figure 19:
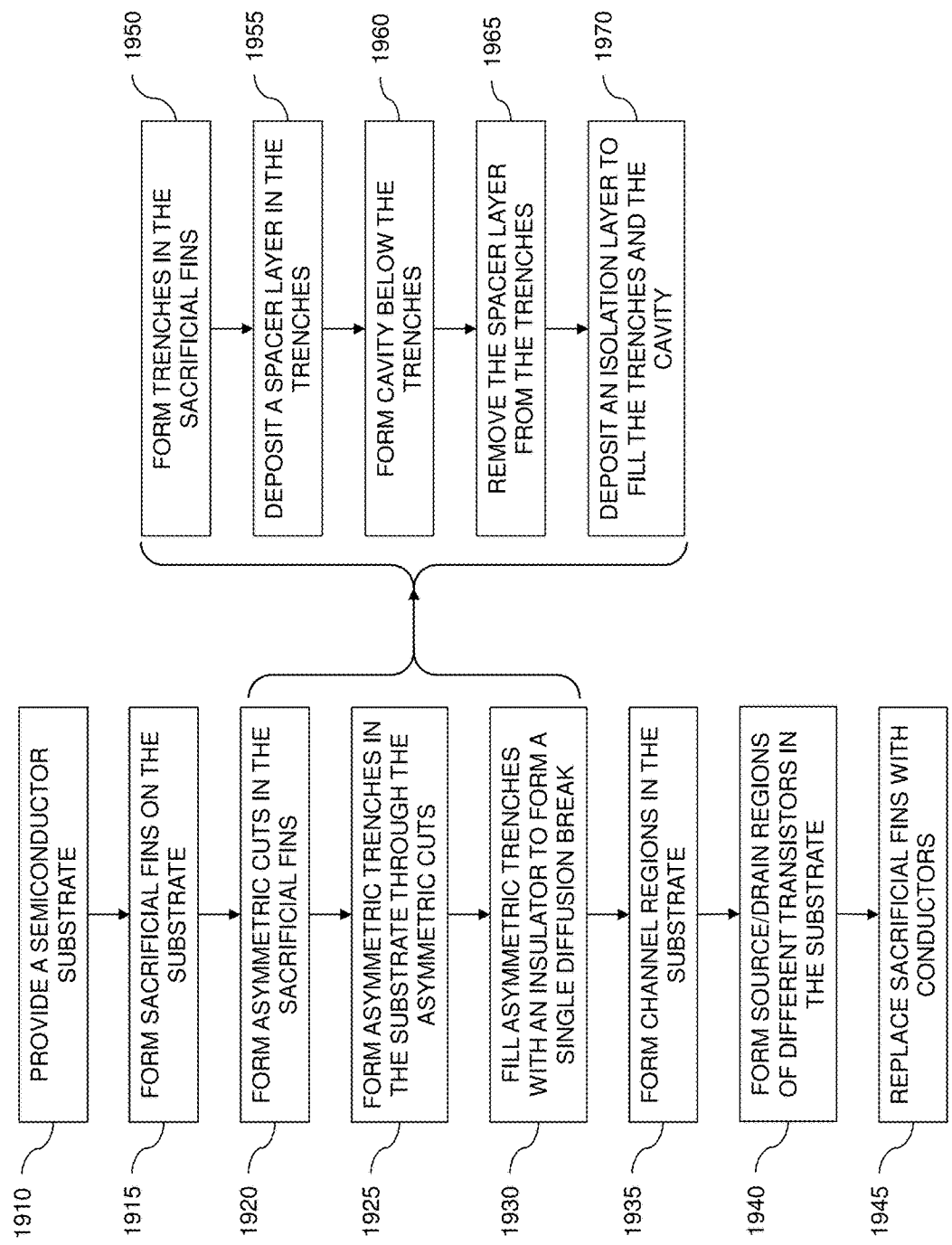
FIG. 19 is flow diagram, according to methods herein.

FIG. 19 is a flow diagram illustrating the processing flow of an exemplary method of fabricating an asymmetric single-diffusion break between complementary transistors, according to devices and methods herein. At 1910, a semiconductor substrate is provided. Sacrificial fins are formed in parallel on the substrate, at 1915. The sacrificial fins include a middle fin between two adjacent fins. The middle fin is in a location for a dummy gate and the two adjacent fins are in locations for gate conductors of adjacent complementary transistors. At 1920, portions of the sacrificial fins are removed to form asymmetric cuts in the sacrificial fins. The asymmetric cuts have relatively larger gaps between fin portions that are closest to the substrate. Asymmetric trenches are formed in the substrate through the asymmetric cuts, at 1925. Deeper portions of the asymmetric trenches are relatively wider than shallower portions. The asymmetric trenches are formed at least partially into the semiconductor substrate and define active device regions with the sacrificial fins. The asymmetric trenches are filled with an insulator to form a single-diffusion break, at 1930. At 1935, channel regions are formed in the substrate below the two adjacent fins. At 1940, source/drain regions of different transistors are formed in the substrate on opposite sides of the channel regions. The single-diffusion break is between two of the source/drain regions of different ones of the complementary transistors. The sacrificial fins are replaced with conductors to form the dummy gate over the single-diffusion break and the gate conductors over the channel regions, at 1945.

To form the asymmetric cuts, trenches are formed in the sacrificial fins, at 1950. The trenches have a first width. At 1955, a spacer layer is deposited in the trenches. At 1960, a cavity is formed below each of the trenches. The cavity has a depth and a second width, which is greater than the first width. The depth is greater than the second width. At 1965, the spacer layer is removed. At 1970, an isolation layer is deposited to fill the trenches and the cavity below each of the trenches and form single-diffusion break (SDB) isolation regions.

While some exemplary structures are illustrated in the attached drawings, those ordinarily skilled in the art would understand that the drawings are simplified schematic illustrations and that the claims presented below encompass many more features that are not illustrated (or potentially many less) but that are commonly utilized with such devices and systems. Therefore, it is not intended for the claims presented below to be limited by the attached drawings, but instead the attached drawings are merely provided to illustrate a few ways in which the claimed features can be implemented.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises", "comprising", "includes", and/or "including", specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein, are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements). Further, the terms "automated" or "automatically" mean that once a process is started (by a machine or a user), one or more machines perform the process without further input from any user.

The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

The corresponding structures, materials, acts, and equivalents of all means or step plus function elements in the claims below are intended to include any structure, material, or act for performing the function in combination with other claimed elements as specifically claimed. The descriptions of the various devices and methods of the present disclosure have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

The descriptions of the various embodiments of the present invention have been presented for purposes of illustration, but are not intended to be exhaustive or limited to the embodiments disclosed. It will be appreciated that the above-disclosed and other features and functions, or alternatives thereof, may be desirably combined into many other different systems or applications. Many modifications and variations will be apparent to those of ordinary skill in the art without departing from the scope and spirit of the described embodiments. Indeed, various presently unforeseen or unanticipated alternatives, modifications, variations, or improvements therein may be subsequently made by those skilled in the art which are also intended to be encompassed by the following claims. The terminology used herein was chosen to best explain the principles of the embodiments, the practical application or technical improvement over technologies found in the marketplace, or to enable others of ordinary skill in the art to understand the embodiments disclosed herein. However, unless specifically defined in a specific claim itself, steps or components of the devices and methods herein cannot be implied or imported from any above example as limitations to any particular order, number, position, size, shape, angle, color, or material.

What is claimed is:

1. A method comprising:
    forming sacrificial fins in parallel on a substrate, the sacrificial fins including a middle fin between two adjacent fins, the middle fin being in a location for a dummy gate, and the two adjacent fins being in locations for gate conductors of adjacent complementary transistors;
    removing portions of the sacrificial fins by forming asymmetric cuts in the sacrificial fins, the asymmetric cuts having larger gaps between fin portions that are closest to the substrate;
    forming trenches in the substrate through the asymmetric cuts, each trench having a first width, a first depth, and a bottom;
    forming asymmetric trenches in the substrate by cutting a cavity below each trench, the cavity having a second depth measured from the bottom of the trench and a lateral undercut at the bottom of the trench, wherein the lateral undercut has a second width at the bottom of the trench, the second width being larger than the first width;
    filling the asymmetric trenches with an insulator to form a single-diffusion break (SDB);
    forming channel regions in the substrate below the two adjacent fins;

forming source/drain regions of complementary transistors in the substrate on opposite sides of the channel regions, the single-diffusion break being between two of the source/drain regions of different ones of the adjacent complementary transistors; and replacing the sacrificial fins with conductors to form the dummy gate over the single-diffusion break and the gate conductors over the channel regions.

2. The method according to claim 1, the forming asymmetric trenches in the substrate further comprising:

forming trenches in the sacrificial fins defining an active device region with the sacrificial fins;

depositing a spacer layer in the trenches;

forming a cavity below each of the trenches;

removing the spacer layer; and depositing an isolation layer so as to fill the trenches and the cavity below each of the trenches, forming the single-diffusion break (SDB).

3. The method according to claim 2, the forming a cavity below each of the trenches further comprising:

using an isotropic etch process on the bottom of the trench.

4. The method according to claim 2, the forming a cavity below each of the trenches further comprising:

using an anisotropic etch process on the bottom of the trench to extend the first depth of the trench to a second depth, oxidizing the trench, and removing oxidized portions of the substrate, leaving a cavity.

5. The method of claim 2, wherein the cavity has a second depth and a second width, the second width being greater than the first width, and the second depth being greater than the second width.

6. The method of claim 1, wherein the sacrificial fin has a first top surface, wherein the source/drain regions of the different ones of the adjacent complementary transistors have second top surfaces, and wherein the method further comprises forming contacts between the first top surface and the second top surfaces.

7. The method according to claim 6, further comprising:

depositing a conformal dielectric layer on the first top surface and the second top surfaces;

forming metal plug openings through the conformal dielectric layer to the source/drain regions of the adjacent complementary transistors;

forming, in the metal plug openings, metal plugs;

forming a contact opening through the conformal dielectric layer to the gate conductors; and filling the contact opening with conductive material to form a first contact to a first one of the complementary transistors and a second contact to a second one of the complementary transistors.

8. The method of claim 1, wherein the complementary transistors comprise a complementary metal oxide semiconductor (CMOS) device with both an N-type field effect transistor (NFET) and a P-type field effect transistor (PFET).

9. A method comprising:

forming a first semiconductor body for a first-type field effect transistor and a second semiconductor body for a second-type field effect transistor in a substrate, the first-type field effect transistor being adjacent to the second-type field effect transistor;

forming, on a first channel region in the first semiconductor body and a second channel region in the second semiconductor body, sacrificial fins in parallel, the sacrificial fins including a middle fin between two adjacent fins, the middle fin being in a location for a dummy gate, and the two adjacent fins being in locations for gate conductors of the first-type field effect transistor and the second-type field effect transistor;

removing portions of the sacrificial fins to form asymmetric cuts in the sacrificial fins, the asymmetric cuts having larger gaps between fin portions that are closest to the substrate;

forming trenches in the substrate through the asymmetric cuts, each trench having a first width, a first depth, and a bottom;

forming asymmetric trenches in the substrate by cutting a cavity below each trench, the cavity having a second depth measured from the bottom of the trench and a lateral undercut at the bottom of the trench, wherein the lateral undercut has a second width at the bottom of the trench, the second width being larger than the first width;

filling the asymmetric trenches with an insulator to form a single-diffusion break;

forming source/drain regions of the first-type field effect transistor and the second-type field effect transistor in the substrate on opposite sides of the first channel region and the second channel region, respectively, the single-diffusion break being between two of the source/drain regions of the transistors; and replacing the sacrificial fins with conductors to form the dummy gate over the single-diffusion break and the gate conductors over the channel regions.

10. The method according to claim 9, the forming asymmetric trenches in the substrate further comprising:

forming trenches in the sacrificial fins defining an active device region with the sacrificial fins;

depositing a spacer layer in the trenches;

forming a cavity below each of the trenches;

removing the spacer layer; and depositing an isolation layer so as to fill the trenches and the cavity below each of the trenches, forming the single-diffusion break (SDB).

11. The method according to claim 10, the forming a cavity below each of the trenches further comprising:

using an isotropic etch process on the bottom of the trench.

12. The method according to claim 10, the forming a cavity below each of the trenches further comprising:

using an anisotropic etch process on the bottom of the trench to extend the first depth of the trench to a second depth, oxidizing the trench, and removing oxidized portions of the substrate, leaving a cavity.

13. The method of claim 10, wherein the cavity has a second depth and a second width, the second width being greater than the first width, and the second depth being greater than the second width.

14. The method according to claim 9, further comprising:

depositing a conformal dielectric layer on the first semiconductor body and the second semiconductor body;

forming metal plug openings through the conformal dielectric layer to the source/drain regions of the first-type field effect transistor and the second-type field effect transistor;

forming, in the metal plug openings, metal plugs;

forming a contact opening through the conformal dielectric layer to the gate conductors of the first-type field effect transistor and the second-type field effect transistor; and filling the contact opening with conductive material to form a first contact to the first-type field effect transistor and a second contact to the second-type field effect transistor.

15. The method of claim 9, wherein the first-type field effect transistor and the second-type field effect transistor comprise a complementary metal oxide semiconductor (CMOS) device with both an N-type field effect transistor (NFET) and a P-type field effect transistor (PFET).

16. A method comprising:

forming sacrificial fins in parallel on a substrate, the sacrificial fins including a middle fin between two adjacent fins, the middle fin being in a location for a dummy gate, and the two adjacent fins being in locations for gate conductors of adjacent complementary transistors;

removing portions of the sacrificial fins by forming cuts in the sacrificial fins, the cuts having larger gaps between fin portions that are closest to the substrate;

forming a single-diffusion break (SDB) in the substrate by
forming a trench in the substrate through the cuts, the trench having a first width, a first depth, and a bottom,
depositing a spacer layer in the trench,
cutting a cavity below the trench, the cavity having a second depth measured from the bottom of the trench and a lateral undercut at the bottom of the trench, wherein the lateral undercut has a second width, the second width being larger than the first width at the bottom of the trench,
removing the spacer layer, and
filling the trench and cavity with an insulator;

forming channel regions in the substrate below the two adjacent fins;

forming source/drain regions of complementary transistors in the substrate on opposite sides of the channel regions, the single-diffusion break being between two of the source/drain regions of different ones of the adjacent complementary transistors, wherein the adjacent complementary transistors comprise a complementary metal oxide semiconductor (CMOS) device with both an N-type field effect transistor (NFET) and a P-type field effect transistor (PFET); and replacing the sacrificial fins with conductors to form the dummy gate over the single-diffusion break and the gate conductors over the channel regions.

17. The method according to claim 16, the cutting a cavity below the trench further comprising:

using an isotropic etch process on the bottom of the trench.

18. The method according to claim 16, the cutting a cavity below the trench further comprising:

using an anisotropic etch process on the bottom of the trench to extend the first depth of the trench to a second depth,
oxidizing the trench, and
removing oxidized portions of the substrate, leaving a cavity.

19. The method according to claim 16, wherein the cavity has a second depth and a second width, the second width being greater than the first width, and the second depth being greater than the second width.

20. The method according to claim 16, further comprising:

depositing a conformal dielectric layer on the conductors and the source/drain regions of the complementary transistors;

forming metal plug openings through the conformal dielectric layer to the source/drain regions of the complementary transistors;

forming metal plugs in the metal plug openings;

forming a contact opening through the conformal dielectric layer to the gate conductors; and filling the contact opening with conductive material to form a first contact to a gate conductor for the NFET and a second contact to a gate conductor for the PFET.

* * * * *